US012684755B2

(12) United States Patent
Yang et al.

(10) Patent No.: US 12,684,755 B2
(45) Date of Patent: Jul. 14, 2026

(54) SEMICONDUCTOR STRUCTURE AND METHOD FOR FORMING SAME

(71) Applicant: CHANGXIN MEMORY TECHNOLOGIES, INC., Hefei City (CN)

(72) Inventors: Mengmeng Yang, Hefei City (CN); Yi Tang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 399 days.

(21) Appl. No.: 18/451,089

(22) Filed: Aug. 16, 2023

(65) Prior Publication Data

US 2024/0057308 A1 Feb. 15, 2024

Related U.S. Application Data

(63) Continuation of application No. PCT/CN2022/123764, filed on Oct. 8, 2022.

(30) Foreign Application Priority Data

Aug. 15, 2022 (CN) .......................... 202210981609.6

(51) Int. Cl.
*H10B 12/00* (2023.01)

(52) U.S. Cl.
CPC ............. *H10B 12/05* (2023.02); *H10B 12/03* (2023.02); *H10B 12/482* (2023.02)

(58) Field of Classification Search
CPC ........ H10B 12/02; H10B 12/03; H10B 12/05; H10B 12/482
See application file for complete search history.

(56) References Cited

U.S. PATENT DOCUMENTS

| | | | |
|---|---|---|---|
| 11,152,284 | B1 | 10/2021 | Sato |
| 2021/0351109 | A1 | 11/2021 | Sato |

(Continued)

FOREIGN PATENT DOCUMENTS

| | | |
|---|---|---|
| CN | 106328654 A | 1/2017 |
| CN | 113488471 A | 10/2021 |

(Continued)

OTHER PUBLICATIONS

TW office action in application No. 112130475 issued on May 16, 2024.

(Continued)

*Primary Examiner* — Hoai V Pham
(74) *Attorney, Agent, or Firm* — Syncoda LLC; Feng Ma

(57) ABSTRACT

A method for forming a semiconductor structure includes the following operations. A substrate is provided and includes a stacked structure and a first isolation structure that are alternately arranged in a first direction. A grid-like etched groove extending in the first direction is formed in the stacked structure and the first isolation structure, and divides the substrate into a first region and a second region that are arranged sequentially in a second direction. The first direction and the second direction are any two directions in a plane where the substrate is located. A second isolation structure is formed in the grid-like etched groove. A transistor structure and a capacitor structure are respectively formed in the first region and the second region, and are isolated by the second isolation structure.

13 Claims, 22 Drawing Sheets

(56) References Cited

U.S. PATENT DOCUMENTS

| | | | | |
|---|---|---|---|---|
| 2021/0408003 | A1 | 12/2021 | Lin | |
| 2022/0085030 | A1 | 3/2022 | Wan | |
| 2022/0199627 | A1 | 6/2022 | Fishburn et al. | |
| 2023/0269928 | A1* | 8/2023 | Yoon | H10B 12/30 |
| | | | | 438/239 |
| 2023/0389263 | A1* | 11/2023 | Li | H10D 88/00 |

FOREIGN PATENT DOCUMENTS

| | | | |
|---|---|---|---|
| CN | 114023703 A | 2/2022 |
| WO | 2021162856 A1 | 8/2021 |
| WO | 2022057328 A1 | 3/2022 |

OTHER PUBLICATIONS

International Search Report in the international application No. PCT/CN2022/123764, mailed on Dec. 21, 2022. 7 Pages with English translation.

* cited by examiner

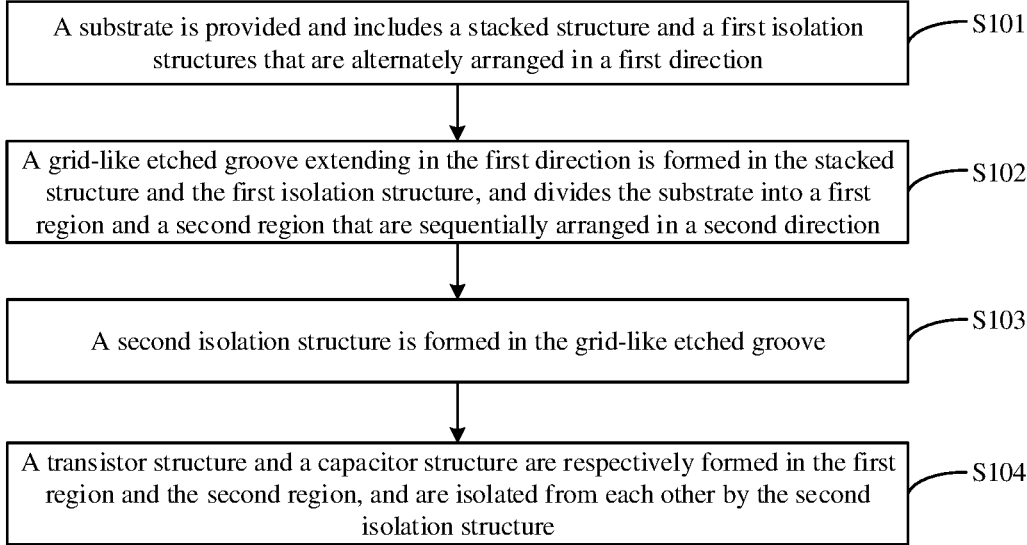

| A substrate is provided and includes a stacked structure and a first isolation structures that are alternately arranged in a first direction | — S101 |

| A grid-like etched groove extending in the first direction is formed in the stacked structure and the first isolation structure, and divides the substrate into a first region and a second region that are sequentially arranged in a second direction | — S102 |

| A second isolation structure is formed in the grid-like etched groove | — S103 |

| A transistor structure and a capacitor structure are respectively formed in the first region and the second region, and are isolated from each other by the second isolation structure | — S104 |

FIG. 1

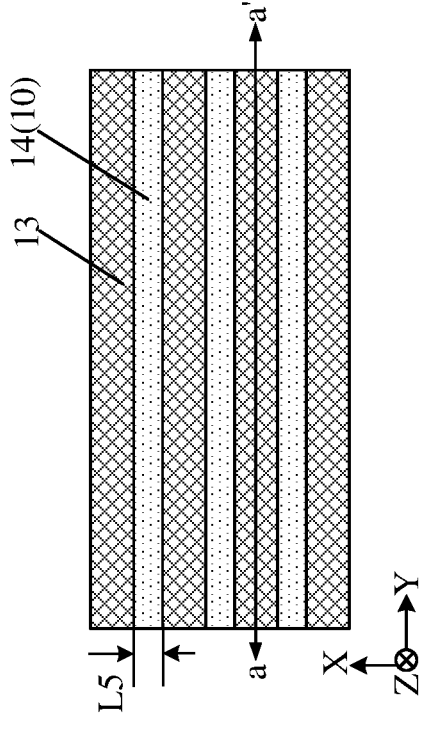
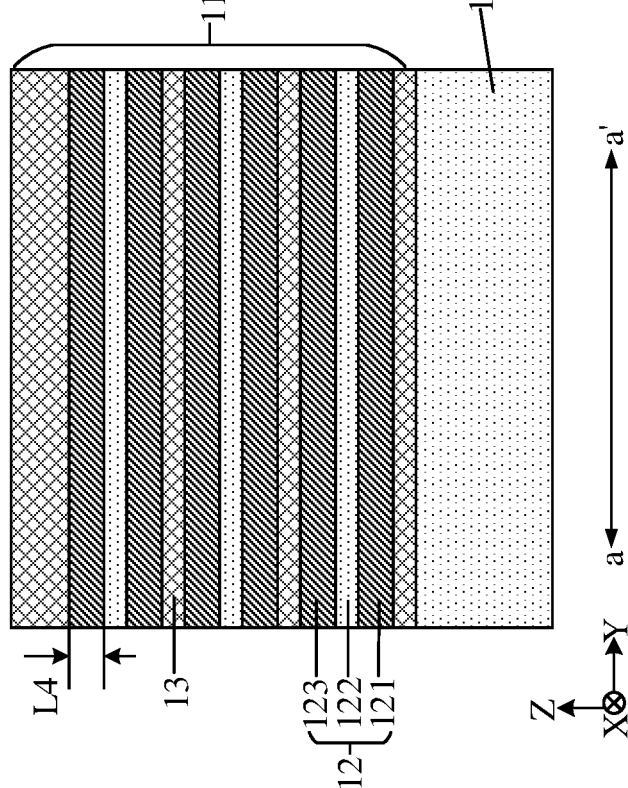
FIG. 2C

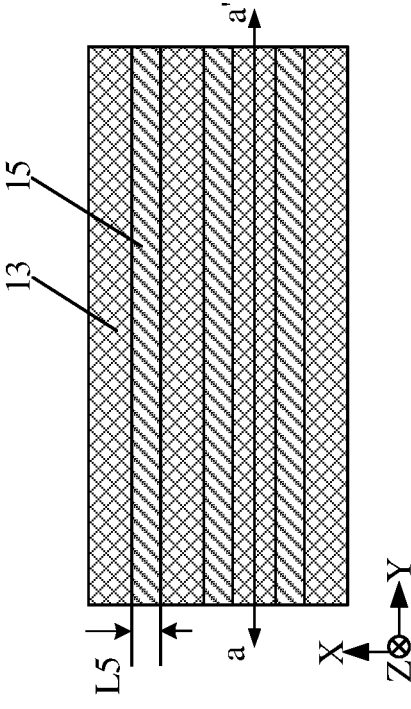
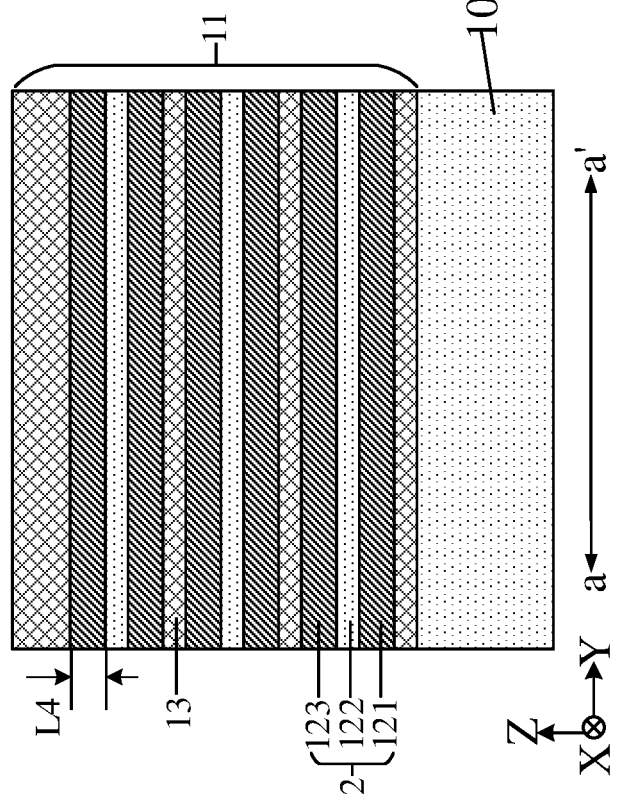
FIG. 2D

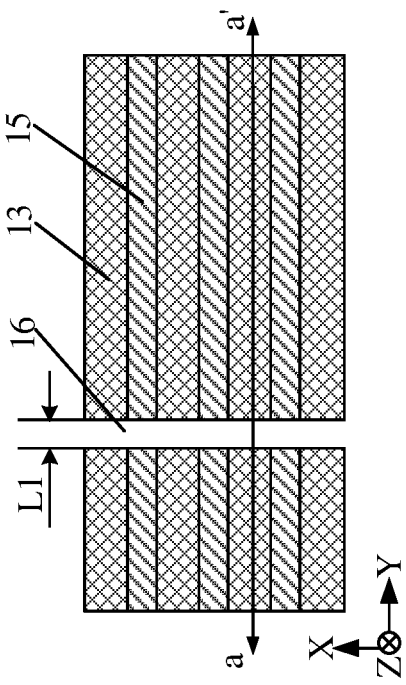
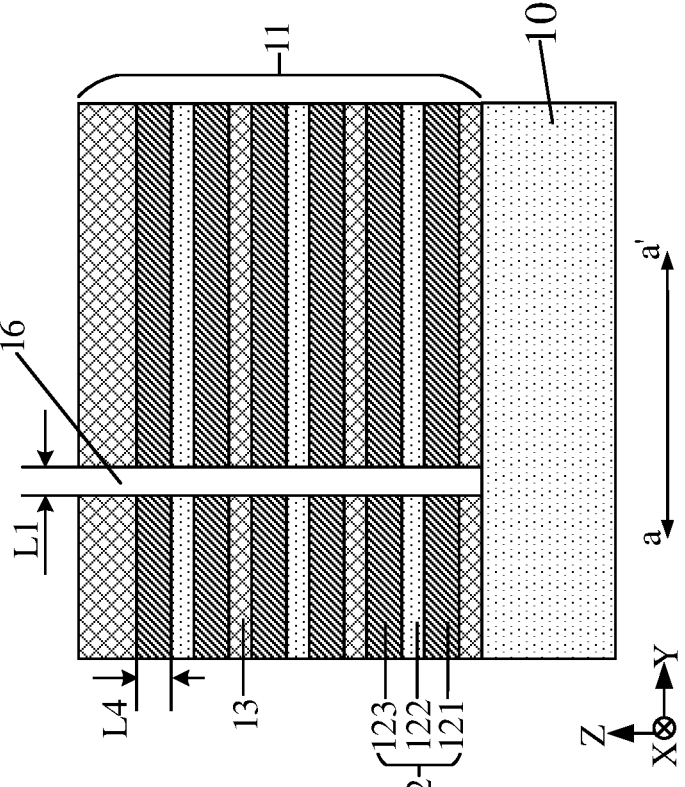
FIG. 2E

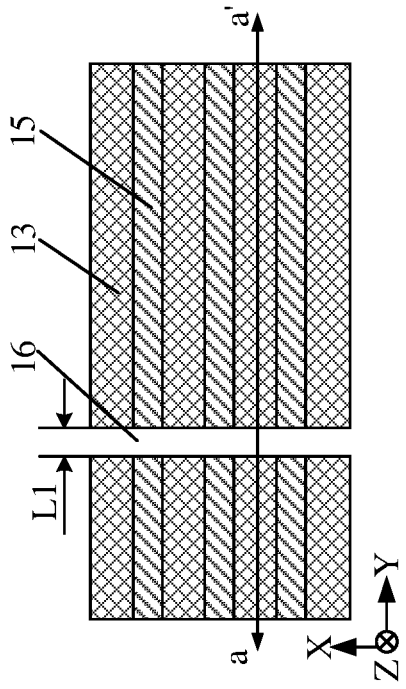
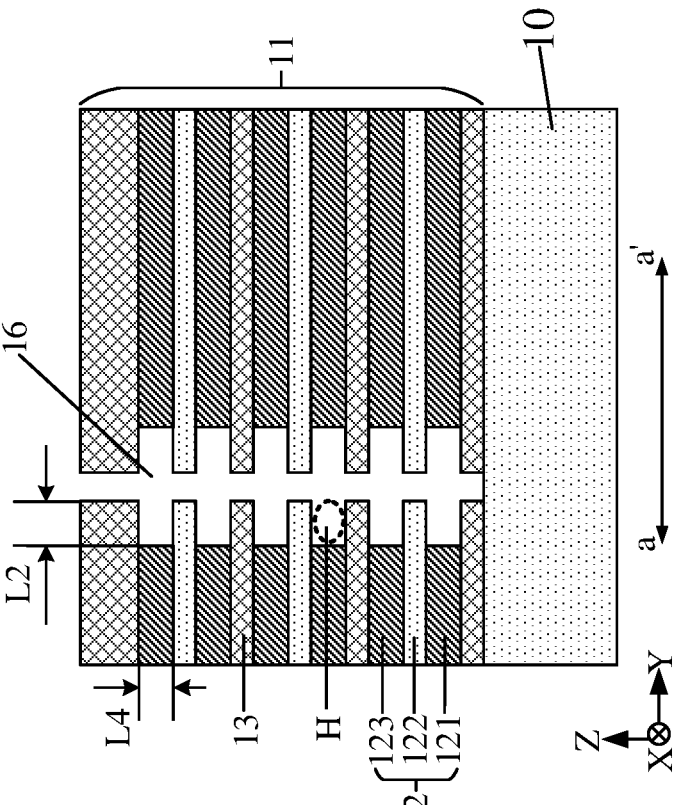
FIG. 2F

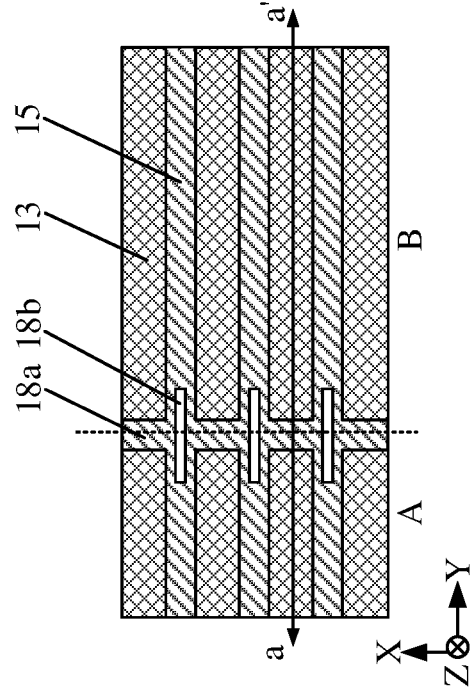
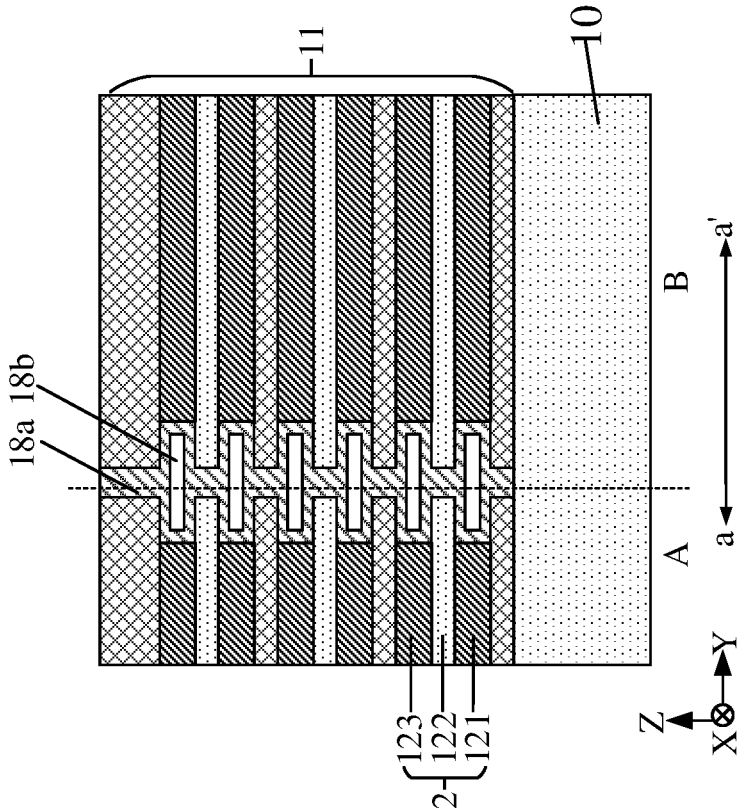
FIG. 2H

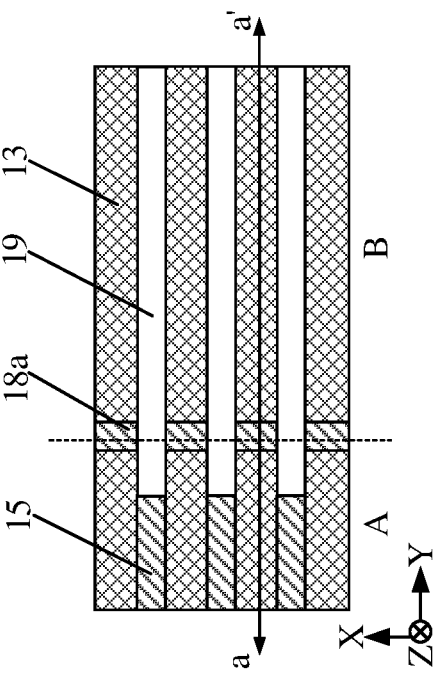
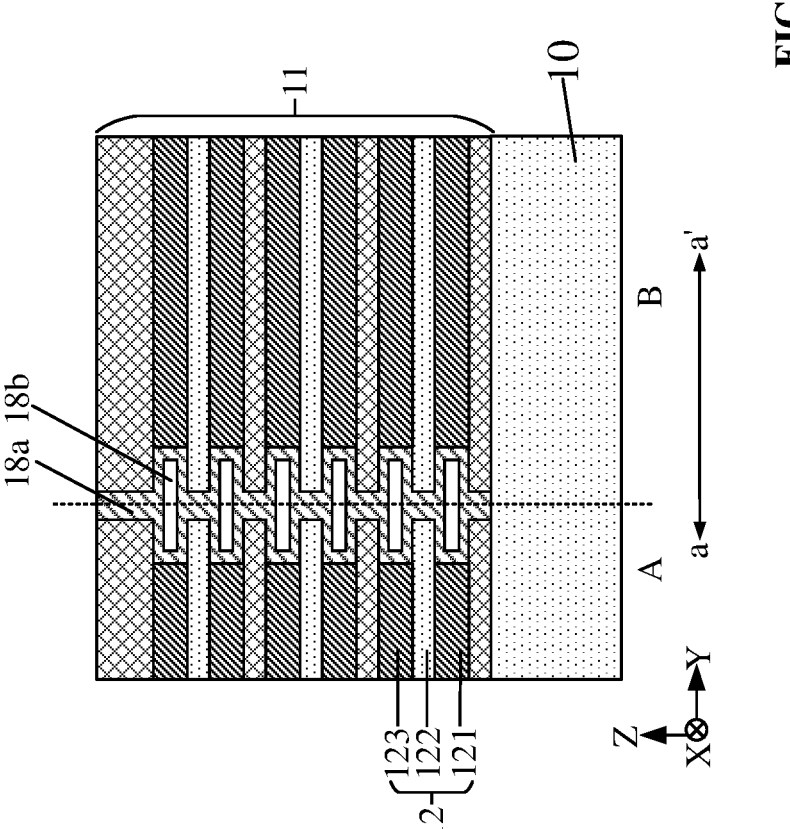
FIG. 2I

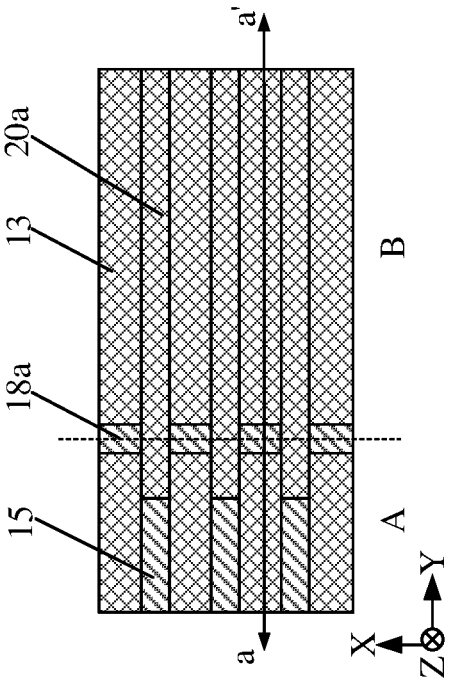
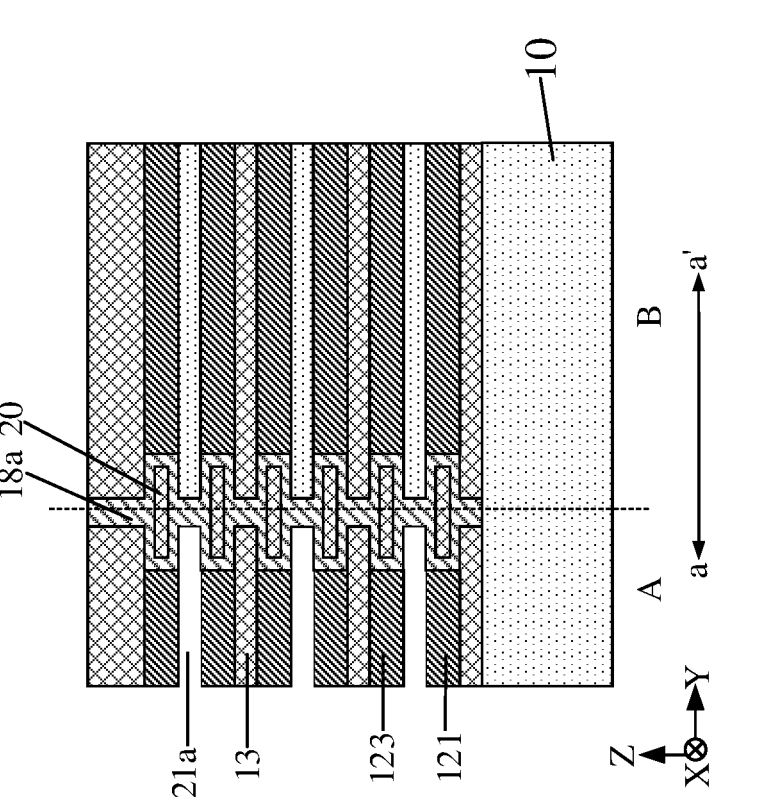
FIG. 2J

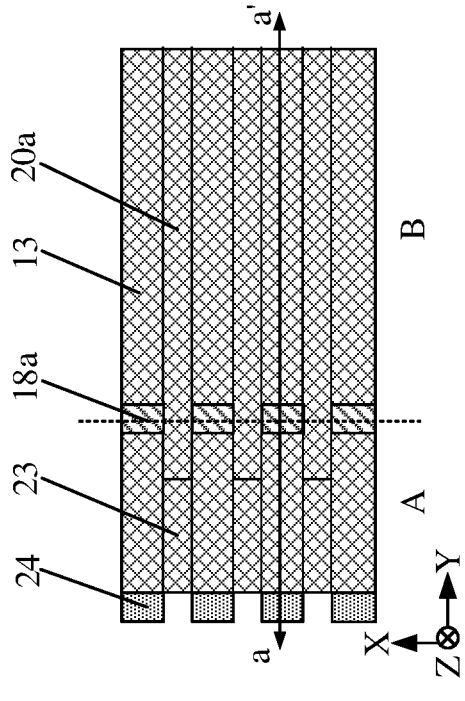
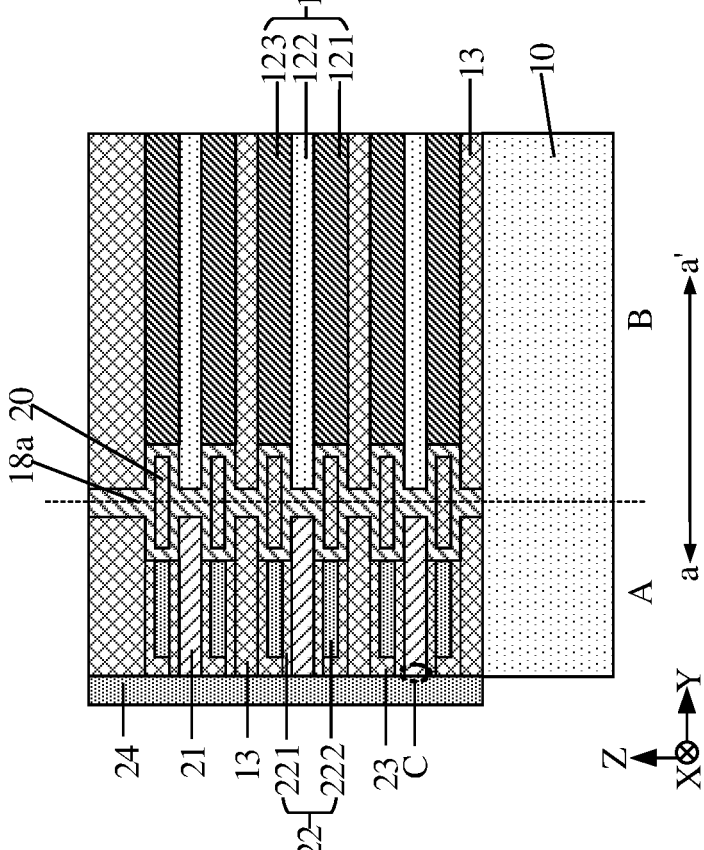
FIG. 2P

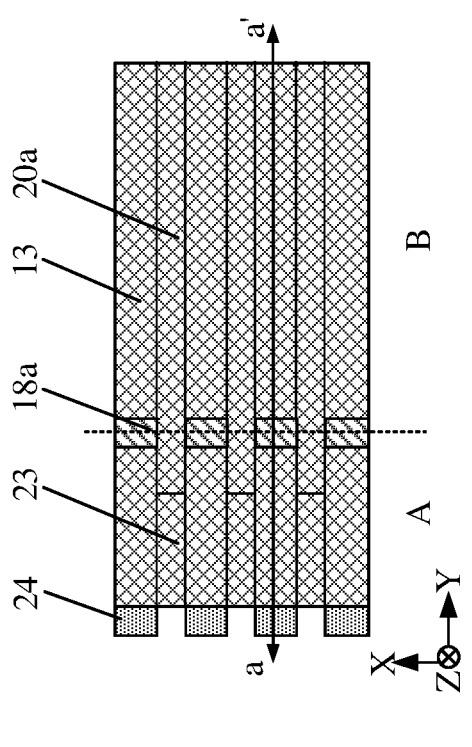
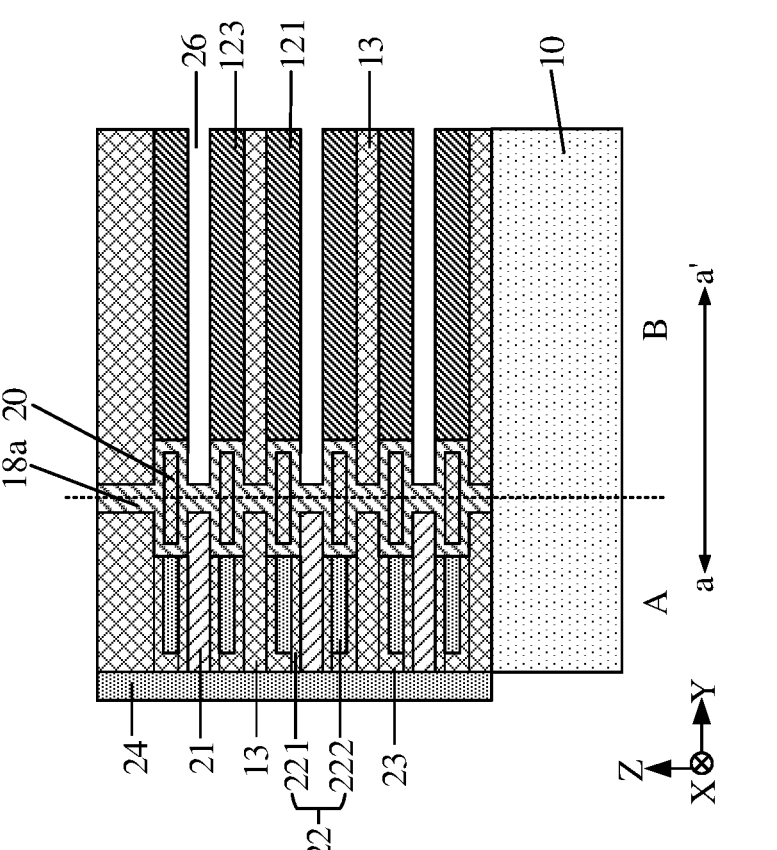
FIG. 2Q

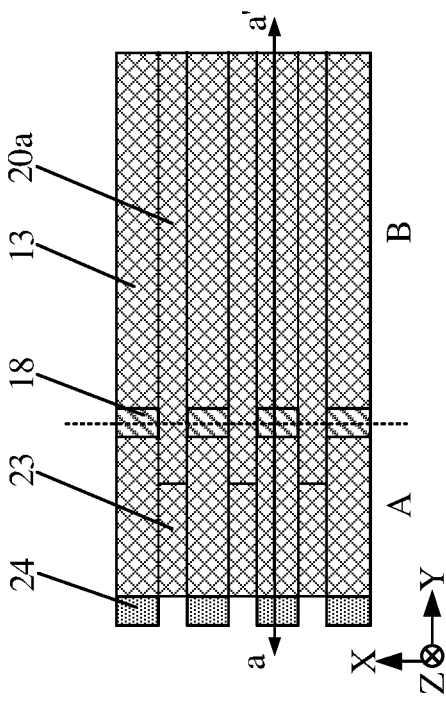
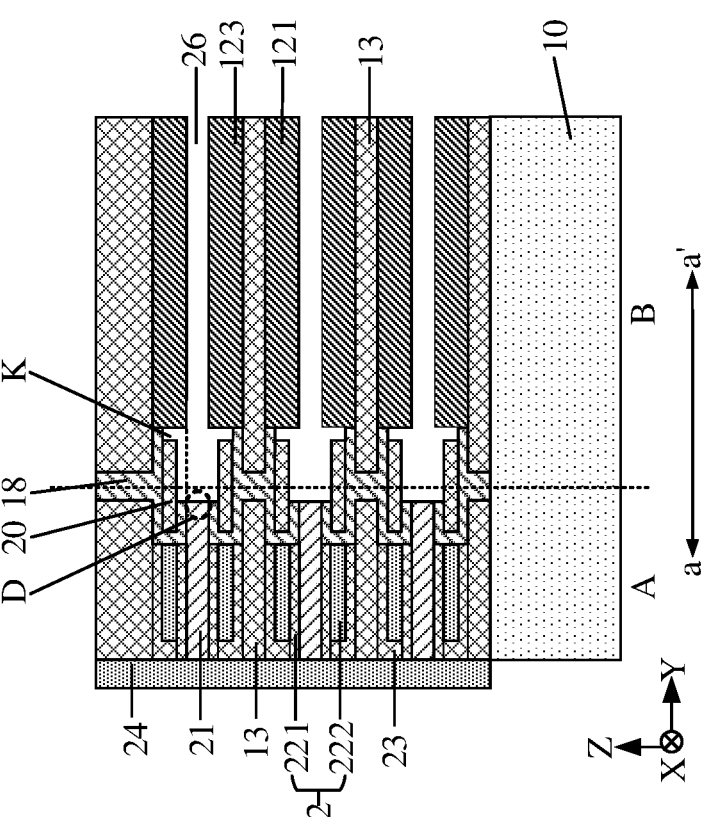
FIG. 2R

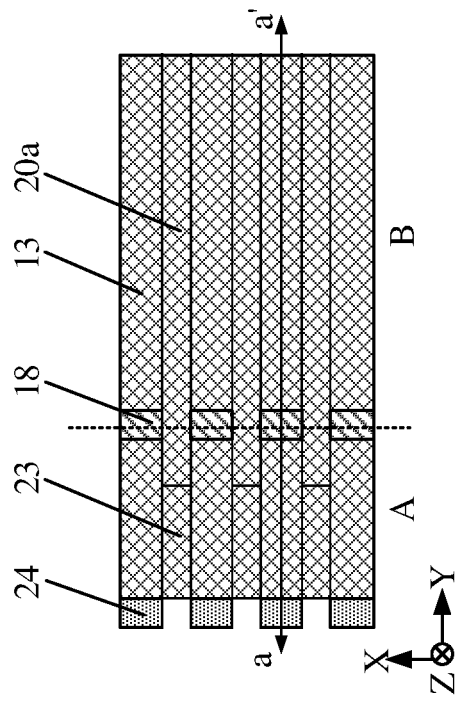
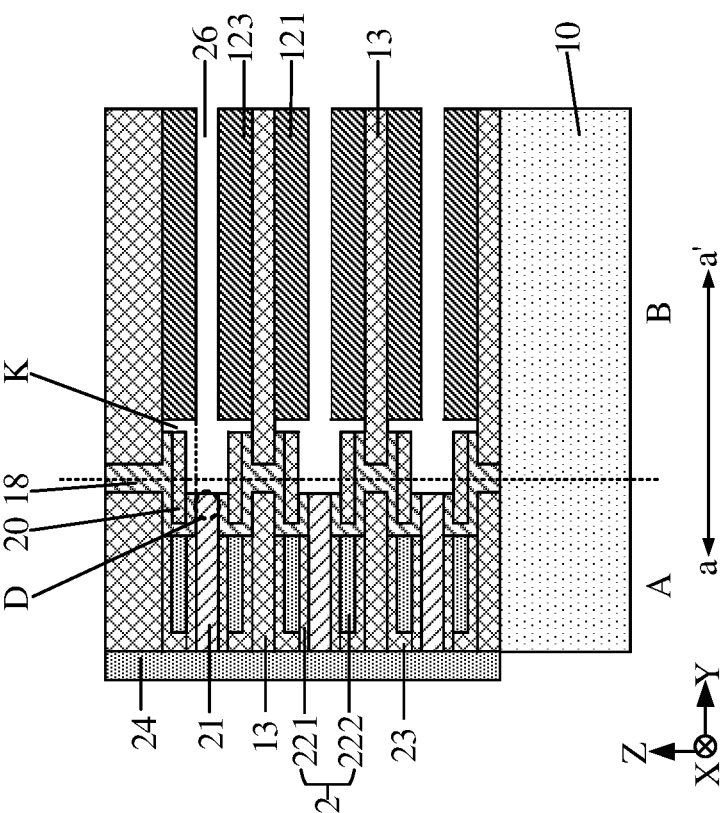
FIG. 2S

SEMICONDUCTOR STRUCTURE AND METHOD FOR FORMING SAME

CROSS-REFERENCE TO RELATED APPLICATIONS

This is a continuation of International Patent Application No. PCT/CN2022/123764 filed on Oct. 8, 2022, which claims priority to Chinese Patent Application No. 202210981609.6 filed on Aug. 15, 2022. The disclosures of the above-referenced applications are hereby incorporated by reference in their entirety.

BACKGROUND

At present, the integration level of semiconductor devices is constantly improving. For example, the structure of a dynamic random access memory (DRAM) has changed from an initial vertical structure to a horizontal structure, which can realize three-dimensional stack and form a multi-layer stacked structure, further improving the storage density of the DRAM.

However, in the multi-layer stacked structure in some implementations, a supporting structure must be formed to isolate a capacitor structure and a transistor structure through it, otherwise the lengths of the capacitor structure and the transistor structure in the multi-layer stacked structure will be inconsistent.

SUMMARY

In view of this, embodiments of the disclosure provide a semiconductor structure and a method for forming the same.

The disclosure relates to the technical field of semiconductors, and relates to, but is not limited to a semiconductor structure and a method for forming the same.

In a first aspect, the embodiments of the disclosure provide a method for forming a semiconductor structure, which includes the following operations.

A substrate is provided, and includes a stacked structure and a first isolation structure that are alternately arranged in a first direction.

A grid-like etched groove extending in the first direction is formed in the stacked structure and the first isolation structure, in which the grid-like etched groove divides the substrate into a first region and a second region that are sequentially arranged in a second direction. The first direction and the second direction are any two directions in a plane where the substrate is located.

A second isolation structure is formed in the grid-like etched groove.

A transistor structure and a capacitor structure are respectively formed in the first region and the second region, and are isolated from each other by the second isolation structure.

In a second aspect, the embodiments of the disclosure provide a semiconductor structure which includes a substrate, a second isolation structure located in the substrate, transistor structures and capacitor structures.

The second isolation structure includes a second isolation layer and a first isolation layer surrounding part of the second isolation layer, and divides the substrate into a first region and a second region that are sequentially arranged in a second direction.

The transistor structures are located in the first region and arranged in an array manner in a first direction and a third direction. The capacitor structures are located in the second region and arranged in an array manner in the first direction and the third direction. Each of the transistor structures and each of the capacitor structures are isolated from each other by the first isolation layer and the second isolation layer. The first direction and the second direction are any two directions in a plane where the substrate is located, and the third direction is intersected with a plane where the substrate is located.

BRIEF DESCRIPTION OF THE DRAWINGS

In the drawings (which are not necessarily drawn to scale), similar reference numerals may describe similar parts in different views. Similar reference numerals with different letter suffixes may represent different examples of similar parts. The various embodiments discussed herein are generally shown in the accompanying drawings by way of example, but not limitation.

FIG. 1 is a schematic flowchart of a method for forming a semiconductor structure provided by an embodiment of the disclosure.

FIG. 2C is a third schematic structural diagram during the method for forming a semiconductor structure provided by an embodiment of the disclosure.

FIG. 2D is a fourth schematic structural diagram during the method for forming a semiconductor structure provided by an embodiment of the disclosure.

FIG. 2E is a fifth schematic structural diagram during the method for forming a semiconductor structure provided by an embodiment of the disclosure.

FIG. 2F is a sixth schematic structural diagram during the method for forming a semiconductor structure provided by an embodiment of the disclosure.

FIG. 2H is an eighth schematic structural diagram during the method for forming a semiconductor structure provided by an embodiment of the disclosure.

FIG. 2I is a ninth schematic structural diagram during the method for forming a semiconductor structure provided by an embodiment of the disclosure.

FIG. 2J is a tenth schematic structural diagram during the method for forming a semiconductor structure provided by an embodiment of the disclosure.

FIG. 2P is a sixteenth schematic structural diagram during the method for forming a semiconductor structure provided by an embodiment of the disclosure.

FIG. 2Q is a seventeenth schematic structural diagram during the method for forming a semiconductor structure provided by an embodiment of the disclosure.

FIG. 2R is an eighteenth schematic structural diagram during the method for forming a semiconductor structure provided by an embodiment of the disclosure.

FIG. 2S is a nineteenth schematic structural diagram during the method for forming a semiconductor structure provided by an embodiment of the disclosure.

DETAILED DESCRIPTION

Figure 2A:
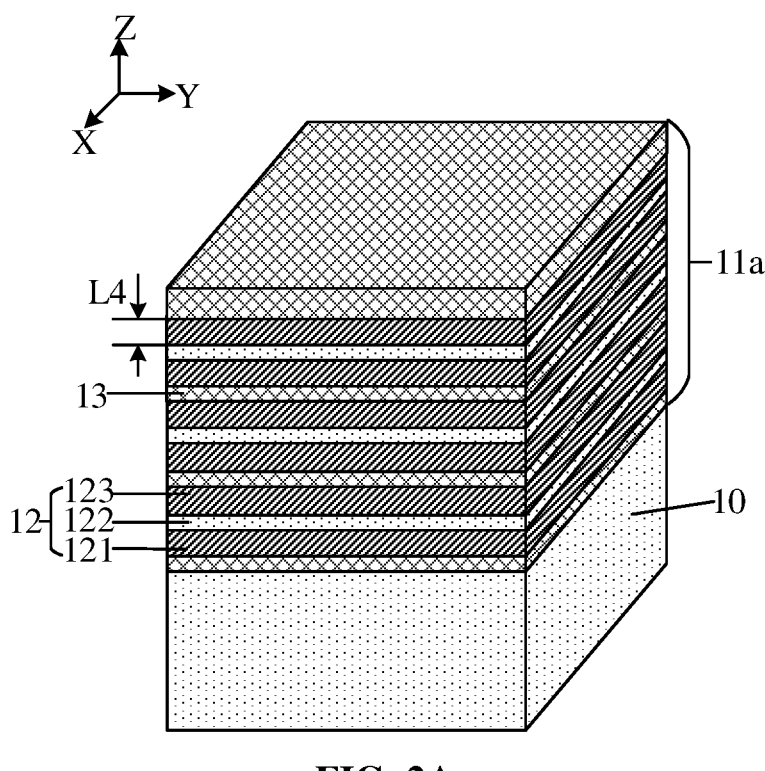
FIG. 2A is a first schematic structural diagram during the method for forming a semiconductor structure provided by an embodiment of the disclosure.

Exemplary embodiments of the disclosure will be described in more detail below with reference to the accompanying drawings. Although the exemplary embodiments of the disclosure are shown in the drawings, it should be understood that the disclosure may be implemented in various forms and should not be limited by the specific embodiments set forth herein. In contrast, these embodiments are provided to enable a more thorough understanding of the disclosure and to fully convey the scope of the disclosure to a person skilled in the art.

In the following description, numerous details are set forth in order to provide a more thorough understanding of the disclosure. However, it is apparent to a person skilled in the art that the disclosure may be implemented without one or more of these details. In other embodiments, in order to avoid confusion with the disclosure, some technical features well-known in the art are not described. That is, not all features of actual embodiments are described herein, and well-known functions and constructions are not described in detail.

In the drawings, the dimensions of a layer, a region, an element or their relative dimensions may be magnified for clarity. The same reference numeral indicates the same element throughout.

It should be understood that while the element or the layer is referred to as being "on . . . ", "adjacent to . . . ", "connected to . . . " or "coupled to . . . " other elements or layers, it may be directly on the other elements or layers, adjacent to, connected or coupled to the other elements or layers, or an intermediate element or layer may be present. In contrast, while the element is referred to as being "directly on . . . ", "directly adjacent to . . . ", "directly connected to . . . " or "directly coupled to . . . " other elements or layers, the intermediate element or layer is not present. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily present in the disclosure.

The terms used here are only intended to describe the specific embodiments and are not limitations to the disclosure. As used here, singular forms of "a", "an" and "said/the" are also intended to include plural forms, unless otherwise clearly indicated in the context. It should also be understood that terms "composing" and/or "including", while used in the description, demonstrate the presence of the described features, integers, steps, operations, elements and/or components, but do not exclude the presence or addition of one or more other features, integers, steps, operations, elements, components, and/or groups. As used herein, a term "and/or" includes any and all combinations of related items listed.

Before introducing embodiments of the disclosure, three directions for describing a stereo structure that may be used in the following embodiments are defined. Taking the Cartesian coordinate system as an example, the three directions may include X-axis, Y-axis and Z-axis directions. A substrate may include a top surface at a front and a bottom surface at a back opposite to the front. A direction that is intersected with (e.g. may be perpendicular to) the top surface and the bottom surface of the substrate is defined as a third direction, regardless of the flatness of the top surface and the bottom surface. Two directions intersecting with each other (e.g. perpendicular to each other) are defined in the direction of the top surface and the bottom surface of the substrate (i.e. the plane in which the substrate is located). For example, the direction in which stacked structure and first isolation structure are alternately arranged may be defined as the first direction, and the extension direction of the first isolation structure may be defined as a second direction. The planar direction of the substrate may be determined based on the first direction and the second direction. In the embodiments of the disclosure, the first direction, the second direction, and the third direction may be perpendicular to each other. However, in other embodiments, the first direction, the second direction, and the third direction may not be perpendicular to each other. In the embodiments of the disclosure, the first direction is defined as an X-axis direction, the second direction is defined as a Y-axis direction, and the third direction is defined as a Z-axis direction.

Embodiments of the disclosure provide a method for forming a semiconductor structure. FIG. 1 is a schematic flowchart of a method for forming a semiconductor structure provided by an embodiment of the disclosure. As shown in FIG. 1, the method for forming a semiconductor structure includes the following operations.

At S101, a substrate is provided, in which the substrate includes a stacked structure and a first isolation structure that are alternately arranged in a first direction.

In the embodiments of the disclosure, the substrate at least includes a base. The base may be a silicon base or may also include other semiconductor elements such as germanium (Ge), semiconductor compounds such as silicon carbide (SiC), gallium arsenide (GaAs), gallium phosphide (GaP), indium phosphide (InP), indium arsenide (InAs) or indium antimonide (InSb); or other semiconductor alloys such as silicon germanium (SiGe), gallium arsenide phosphide (GaAsP), indium aluminum arsenide (AlInAs), gallium aluminum arsenide (AlGaAs), indium gallium arsenide (GaInAs), indium gallium phosphide (GaInP), and/or indium gallium arsenide phosphide (GaInAsP) or combinations thereof.

In the embodiments of the disclosure, the stacked structure includes a sacrificial layer and an isolation layer that are alternately stacked from bottom to top in a third direction. The sacrificial layer includes a first sacrificial layer, a second sacrificial layer, and a third sacrificial layer that are stacked sequentially in the third direction.

In some embodiments, subsequently, part of the first sacrificial layer and part of the third sacrificial layer need to be removed, while the second sacrificial layer is retained. Therefore, during the process of removing the part of the first sacrificial layer and the part of the third sacrificial layer, the etching selectivity ratio between the first sacrificial layer and the base is equal to the etching selectivity ratio between the third sacrificial layer and the base, and the etching selectivity ratio between the first sacrificial layer and the base is greater than the etching selectivity ratio between the second sacrificial layer and the base, or the etching selectivity ratio between the third sacrificial layer and the base is greater than the etching selectivity ratio between the second sacrificial layer and the base, so that not only the part of the first sacrificial layer and the part of the third sacrificial layer can be removed simultaneously during an etching process, but also such removal of the first sacrificial layer and the third sacrificial layer is realized without damaging the second sacrificial layer.

In the embodiments of the disclosure, the first sacrificial layer and the third sacrificial layer may be the same material layer, for example, silicon nitride layer. The second sacrificial layer may be a polysilicon layer, and an isolation layer may be a silicon oxide layer or a silicon oxynitride layer. The material of the first isolation structure may be a low dielectric constant (low K) material or other suitable materials.

At S102, a grid-like etched groove extending in the first direction is formed in the stacked structure and the first isolation structure, in which the grid-like etched groove divides the substrate into a first region and a second region that are sequentially arranged in a second direction.

In the embodiments of the disclosure, the first region and the second region may be used to form different functional structures, respectively. For example, the first region may be used to form a gate structure, a word line structure, a bit line structure, and the second region may be used to form a capacitor structure.

The grid-like etched groove in the embodiments of the disclosure is in grid-like on both sides thereof in the second direction and has a certain thickness in the second direction.

At S103, a second isolation structure is formed in the grid-like etched groove.

In the embodiments of the disclosure, the second isolation structure includes the second isolation layer and a first isolation layer surrounding part of the second isolation layer. In the embodiments of the disclosure, an etching selectivity ratio between the first isolation layer and the base is greater than an etching selectivity ratio between the second isolation layer and the base. For example, the material of the first isolation layer may be a low K material, and the material of the second isolation layer may be silicon oxide.

At S104, a transistor structure and a capacitor structure are respectively formed in the first region and the second region, and are isolated from each other by the second isolation structure.

In the embodiments of the disclosure, the transistor structure includes a gate structure, a source and a drain. The gate structure may be a double-gate structure or a gate-all-around structure.

In the embodiments of the disclosure, a stacked structure formed by stacking a plurality of transistor structures and capacitor structures in the third direction can form a three-dimensional semiconductor structure, so that the integration level of the semiconductor structure can be improved and miniaturization can be realized. In addition, in the embodiments of the disclosure, the distance between the gate structure and the capacitor structure is increased by the second isolation structure (i.e. the first isolation layer and the second isolation layer), and the low K material and silicon oxide are respectively adopted as the first isolation layer and the second isolation layer, so that the parasitic capacitance of the semiconductor structure can be reduced, thereby reducing the capacitance resistance delay and optimizing the response time of the semiconductor structure.

In the embodiments of the disclosure, by forming the second isolation structure as an isolation structure between the transistor structure and the capacitor structure in the semiconductor structure, transistor structures in different layers of the semiconductor structure have the same length, and capacitor structures in different layers also have the same length. In addition, in the embodiments of the disclosure, the above effect can be realized without forming a supporting structure, which simplifies the manufacturing process of the semiconductor structure.

Figure 2B:
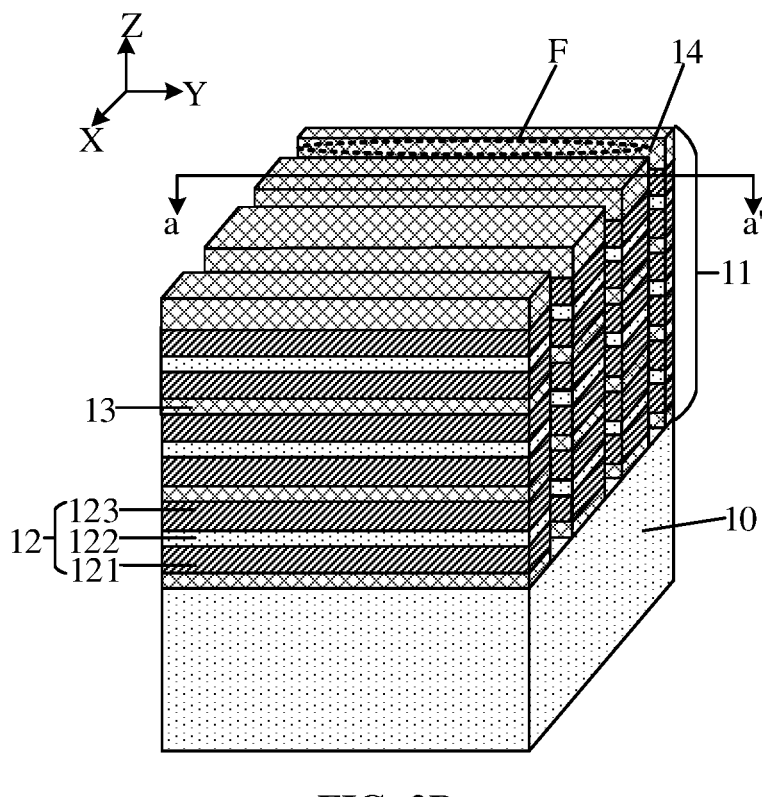
FIG. 2B is a second schematic structural diagram during the method for forming a semiconductor structure provided by an embodiment of the disclosure.
Figure 2G:
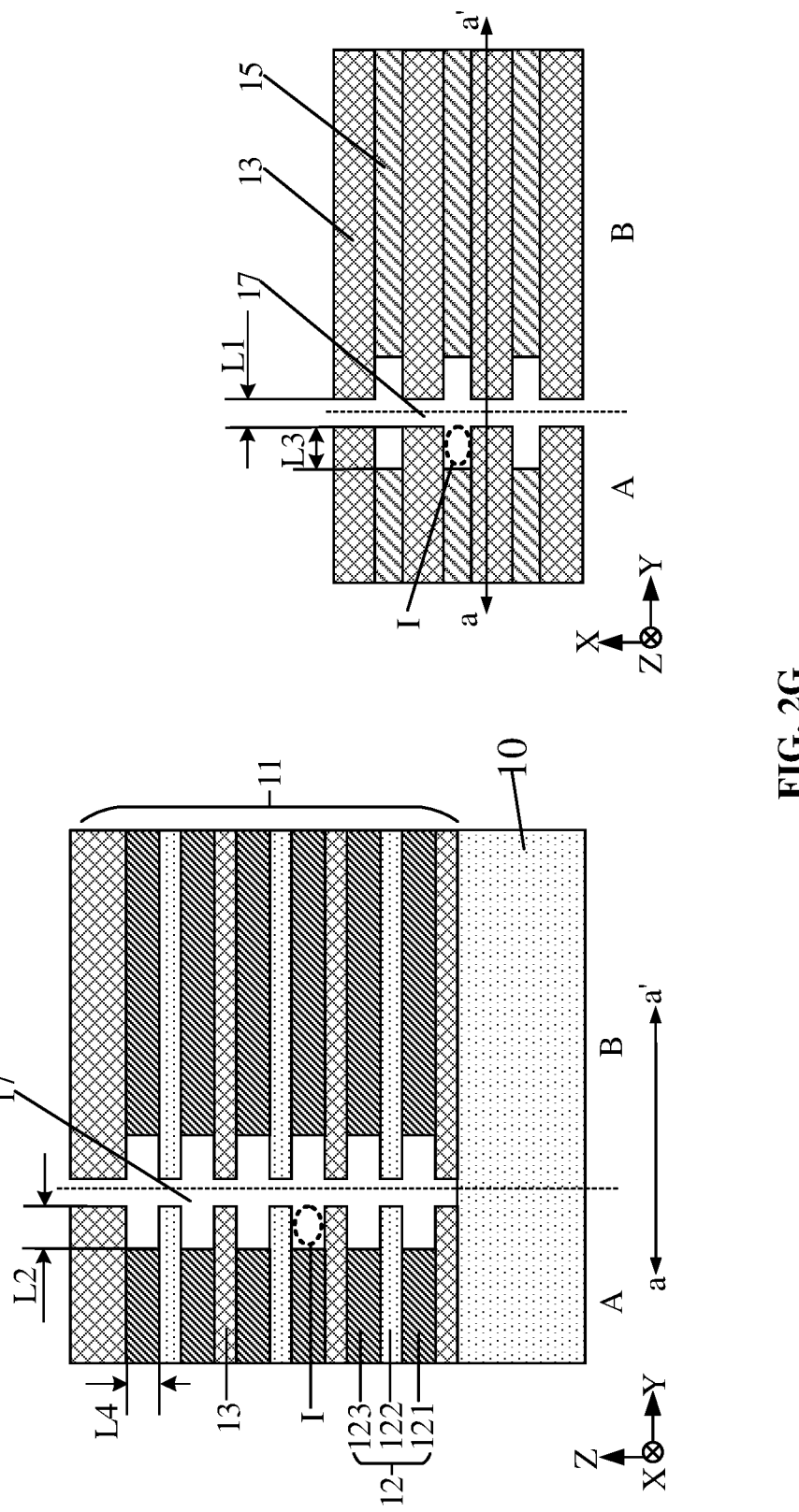
FIG. 2G is a seventh schematic structural diagram during the method for forming a semiconductor structure provided by an embodiment of the disclosure.
Figure 2K:
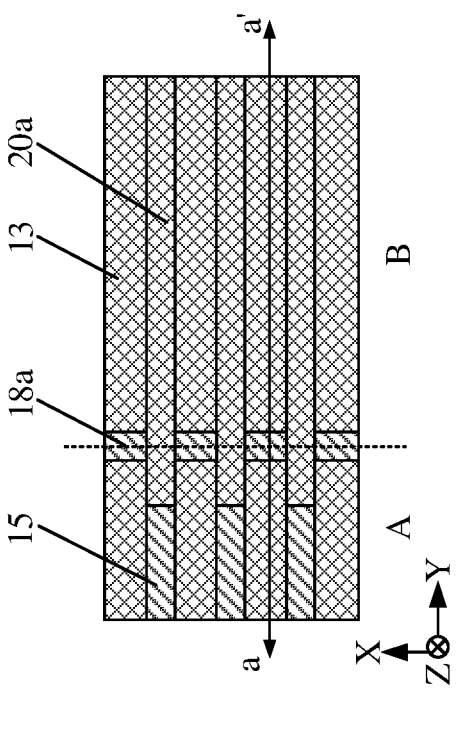
FIG. 2K is an eleventh schematic structural diagram during the method for forming a semiconductor structure provided by an embodiment of the disclosure.
Figure 2L:
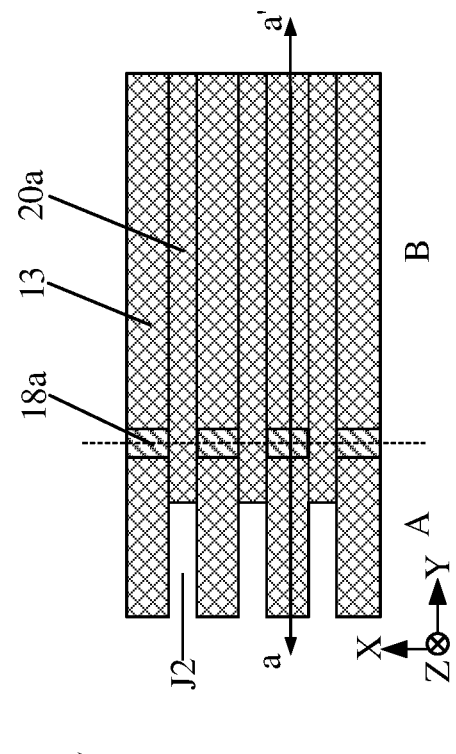
FIG. 2L is a twelfth schematic structural diagram during the method for forming a semiconductor structure provided by an embodiment of the disclosure.
Figure 2M:
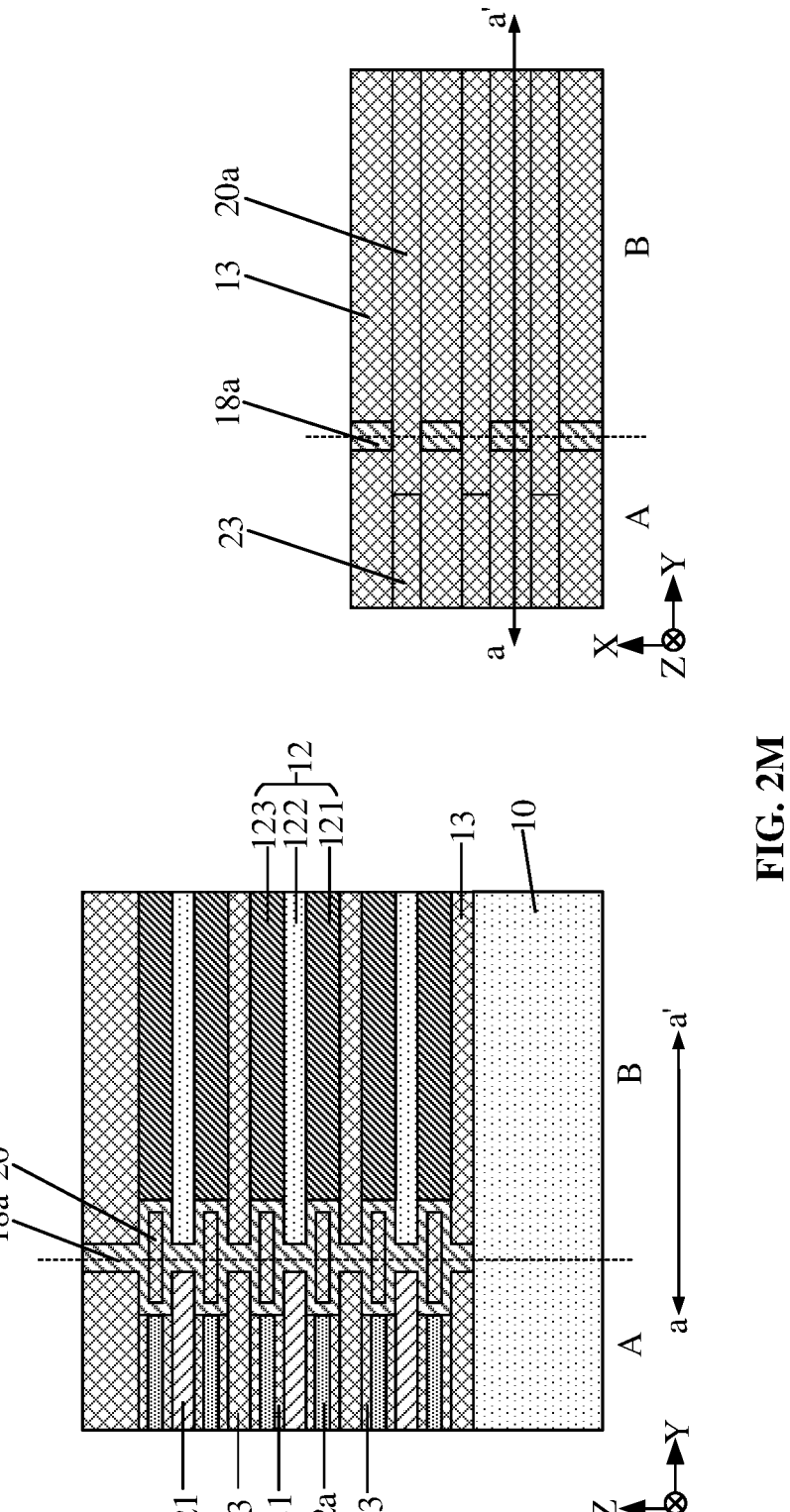
FIG. 2M is a thirteenth schematic structural diagram during the method for forming a semiconductor structure provided by an embodiment of the disclosure.
Figure 2N:
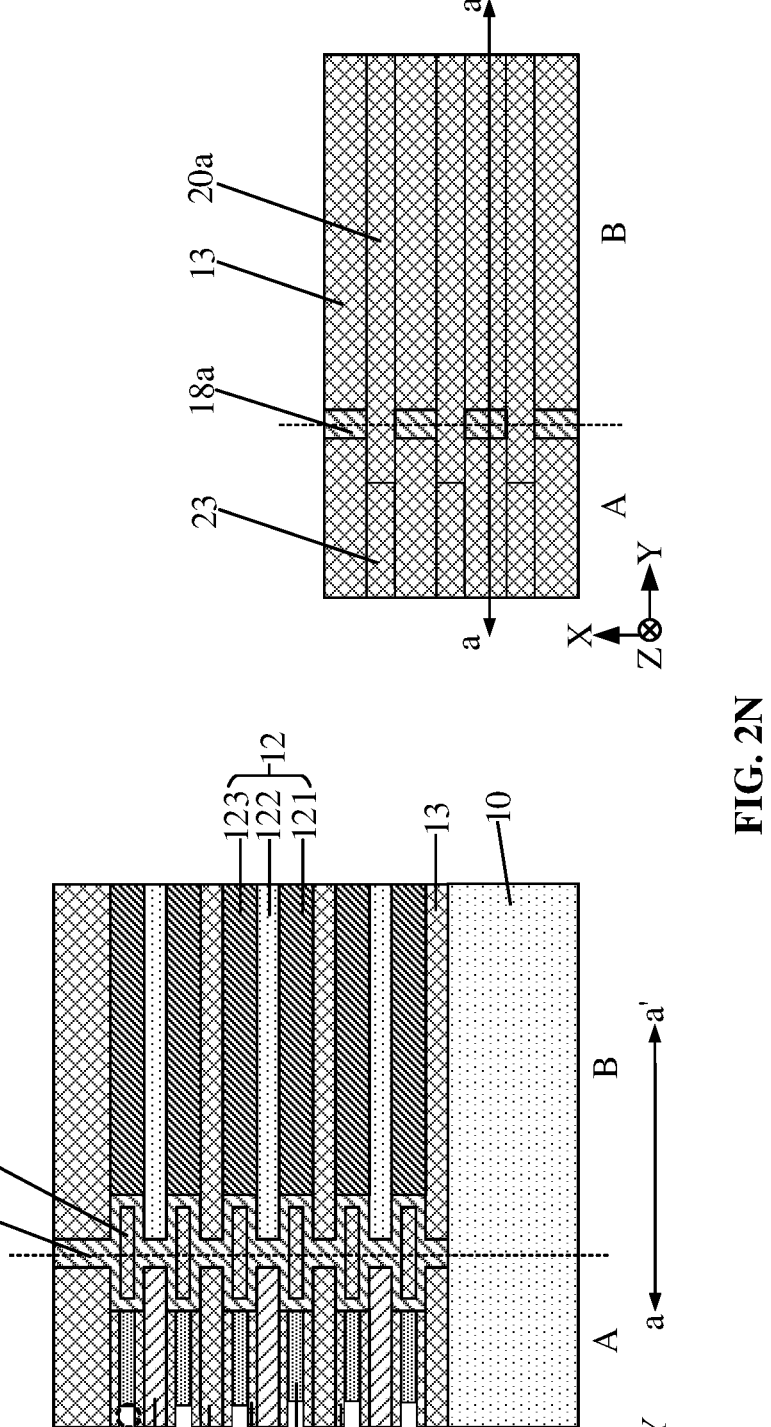
FIG. 2N is a fourteenth schematic structural diagram during the method for forming a semiconductor structure provided by an embodiment of the disclosure.
Figure 2O:
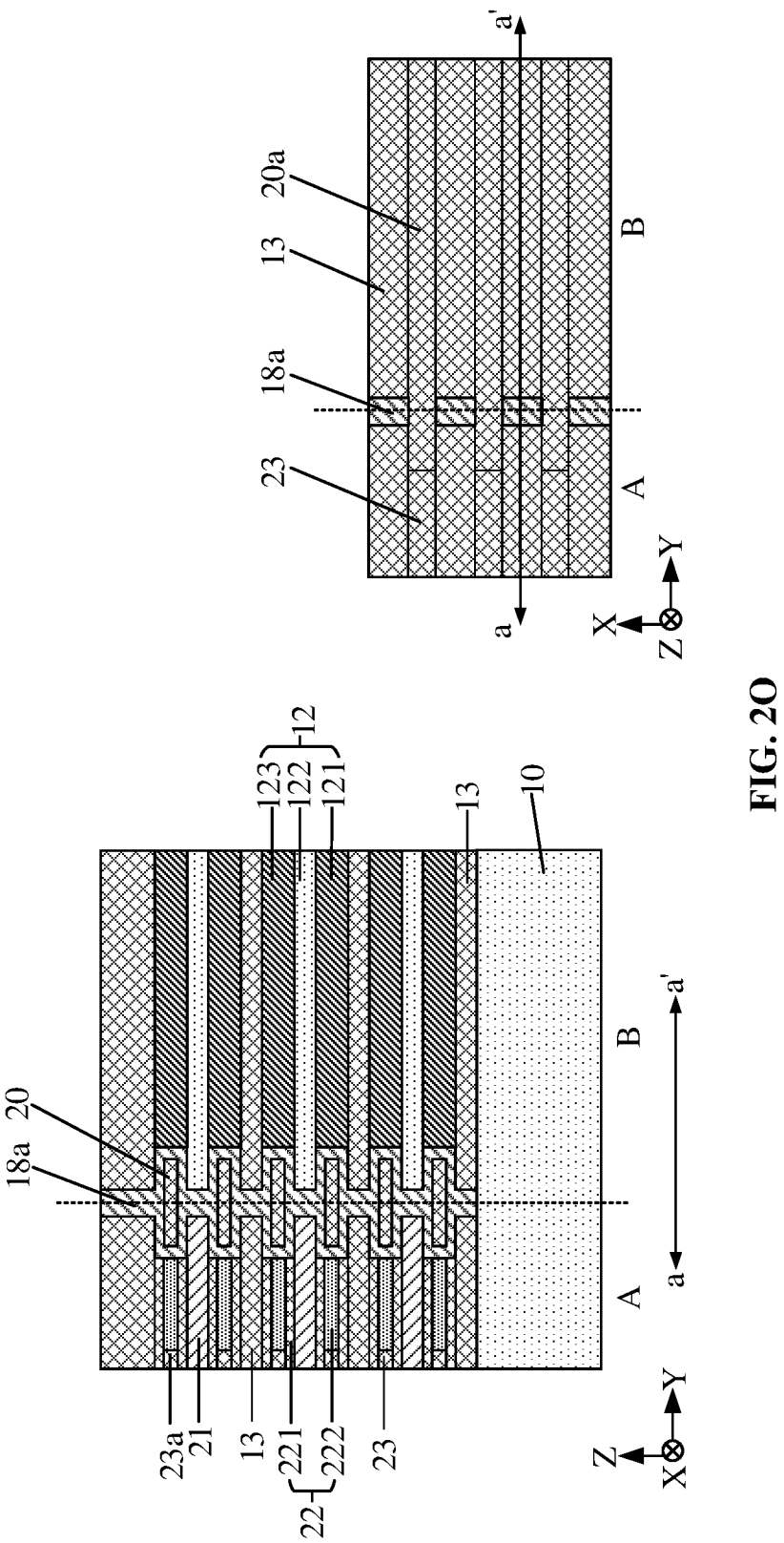
FIG. 2O is a fifteenth schematic structural diagram during the method for forming a semiconductor structure provided by an embodiment of the disclosure.
Figure 2T:
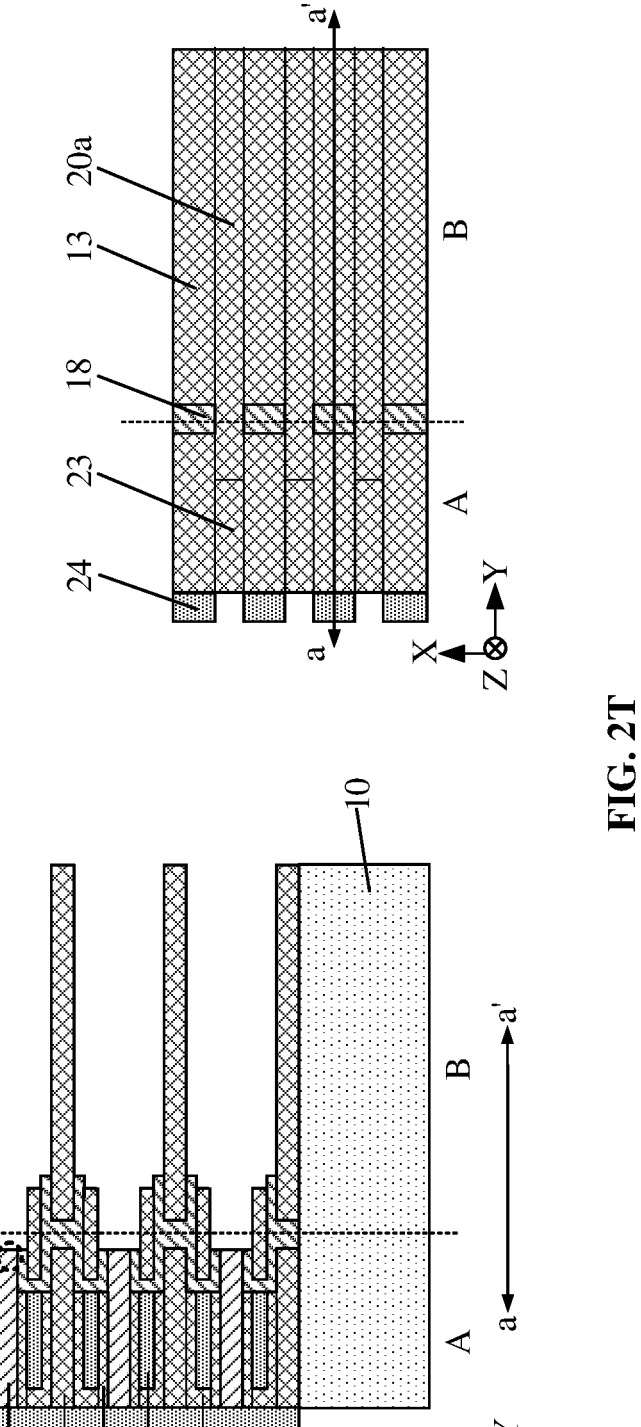
FIG. 2T is a twentieth schematic structural diagram during the method for forming a semiconductor structure provided by an embodiment of the disclosure.
Figure 2U:
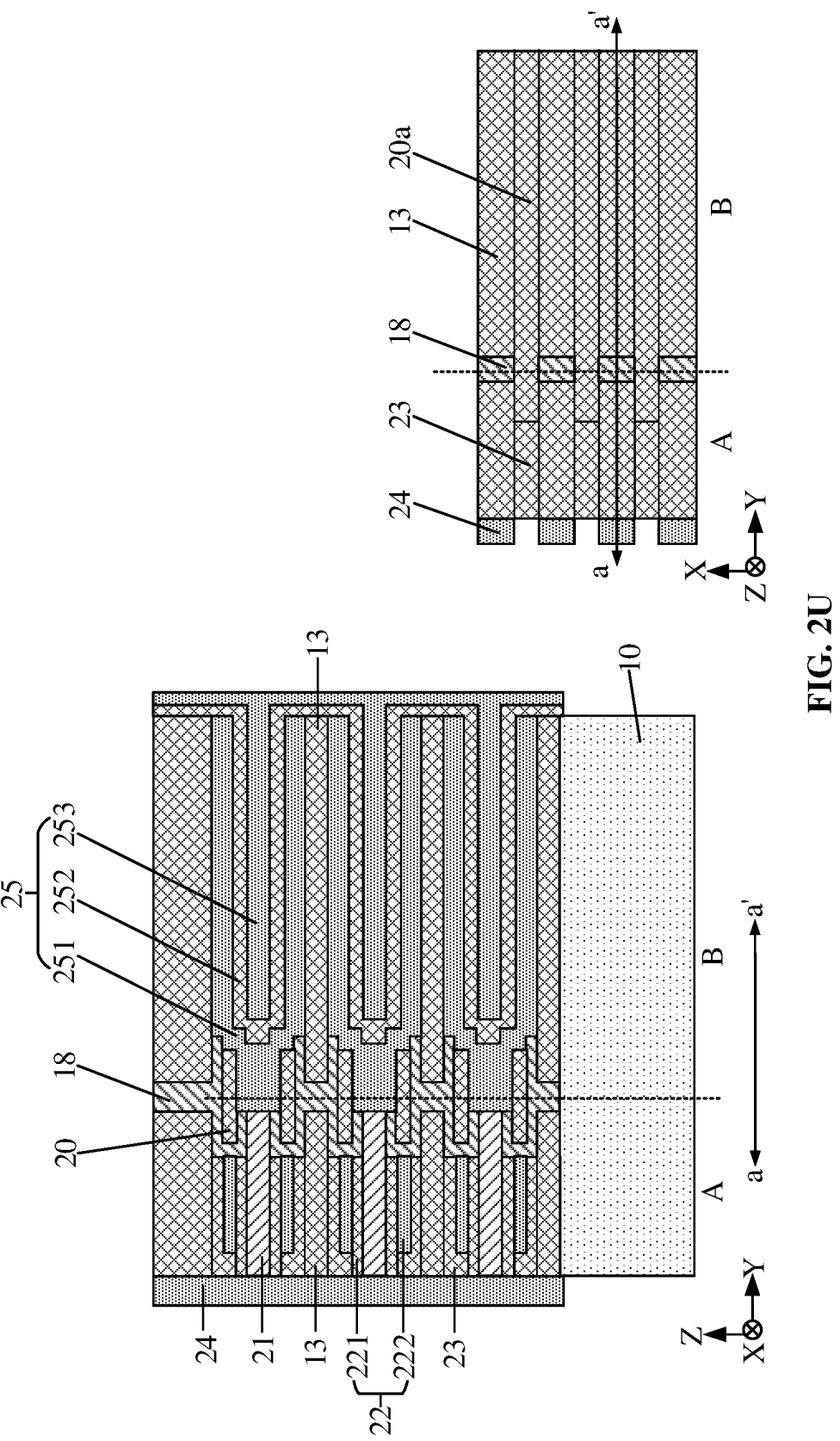
FIG. 2U is a twenty-first schematic structural diagram during the method for forming a semiconductor structure provided by an embodiment of the disclosure.

FIG. 2A to FIG. 2U are schematic structural diagrams during forming a semiconductor structure provided by an embodiment of the disclosure. The forming process of the semiconductor structure provided by the embodiment of the disclosure will be described in detail with reference to FIG. 2A to FIG. 2U. FIG. 2A and FIG. 2B are three-dimensional views, and FIG. 2C to FIG. 2U show top views and sectional views along a-a' during forming the semiconductor structure.

First, operation S101 is performed, in which a substrate is provided, which includes a stacked structure and a first isolation structure that are alternately arranged in a first direction.

In some embodiments, the substrate further includes a base. The stacked structure and the first isolation structure are located on a surface of the base.

In the embodiments of the disclosure, the base may be a silicon base, and may also include other semiconductor elements such as germanium, or semiconductor compounds such as silicon carbide or gallium arsenide.

In some embodiments, the stacked structure and the first isolation structure are formed by the following operations. An initial stacked structure is formed on the surface of the substrate. The initial stacked structure includes a sacrificial layer and an isolation layer that are sequentially stacked in a third direction. A photoresist layer having a preset pattern is formed on a surface of the initial stacked structure. The preset pattern includes sub-patterns arranged at intervals in the first direction, and the sub-patterns expose the initial stacked structure. The exposed initial stacked structure is removed with the photoresist layer to form isolation grooves arranged at intervals in the first direction. The first isolation structure is formed in the isolation groove.

In the embodiments of the disclosure, the number of the sacrificial layers and the number of the isolation layers in the initial stacked structure can be set according to the required storage density. The integration level of the semiconductor structure finally formed is increased with the number of the sacrificial layers and that of isolation layers.

As shown in FIG. 2A, an initial stacked structure 11a is formed on a surface of the substrate 10, includes a sacrificial layer 12 and an isolation layer 13 that are alternately stacked from bottom to top in a Z-axis direction. The sacrificial layer 12 includes a first sacrificial layer 121, a second sacrificial layer 122, and a third sacrificial layer 123 that are sequentially stacked in the Z-axis direction.

In the embodiments of the disclosure, the materials of the first sacrificial layer 121 and the third sacrificial layer 123 may be silicon nitride, the material of the second sacrificial layer 122 may be polysilicon, and the material of the isolation layer may be silicon oxide.

In the embodiments of the disclosure, both of the first sacrificial layer 121 and the third sacrificial layer 123 have a fourth preset dimension L4 in the Z-axis direction, and the fourth preset dimension L4 is 30 nanometers (nm) to 60 nm. The dimension of the second sacrificial layer 122 in the Z-axis direction is 20 nm to 40 nm, and the dimension of the isolation layer 13 in the Z-axis direction is 20 nm to 50 nm.

In the embodiments of the disclosure, the first sacrificial layer 121, the second sacrificial layer 122, the third sacrificial layer 123, and the isolation layer 13 may be formed by any of the following deposition processes: a chemical vapor deposition (CVD) process, a physical vapor deposition (PVD) process, an atomic layer deposition (ALD) process, a spin-on process, a coating process, or a thin-film process.

As shown in FIG. 2A to FIG. 2C, a photoresist layer (not shown) with a preset pattern is formed on a surface of the initial stacked structure 11a. The preset pattern includes sub-patterns F arranged at intervals in the X-axis direction, and the sub-patterns F expose the initial stacked structure 11a. The exposed initial stacked structure 11a is removed by the photoresist layer to form the stacked structure 11 and the isolation groove 14 that are alternately arranged in the X-axis direction.

In the embodiments of the disclosure, the isolation groove 14 has a fifth preset dimension L5 in the X-axis direction, and the fifth preset dimension L5 is 30 nm to 60 nm.

In the embodiments of the disclosure, the exposed initial stacked structure 11a can be removed by a high aspect ratio (HAR) etching to form the stacked structure 11 and the isolation groove 14.

In the embodiments of the disclosure, after forming the stacked structure 11 and the isolation grooves 14, the method for forming a semiconductor structure also includes the following operation. The photoresist layer with the preset pattern is removed to expose the upper surface of the stacked structure 11 (as shown in FIG. 2B and FIG. 2C).

As shown in FIG. 2D, the first isolation structure may be formed by the following operation. A second isolation material is filled in the isolation groove 14 to form the first isolation structure 15. The second isolation material may be a low K material or other suitable materials.

Next, operation S102 is performed, in which a grid-like etched groove extending in the first direction is formed in the stacked structure and the first isolation structure.

In some embodiments, the grid-like etched groove may be formed by the following operations. The stacked structure and the first isolation structure are etched to form a sub-etched groove extending in the first direction. The sub-etched groove has a first preset dimension in the second direction. Taking the surface exposed by the sub-etched groove of the first sacrificial layer and the surface exposed by the sub-etched groove of the third sacrificial layer as etching starting points, the first sacrificial layer is removed with a second preset dimension and the third sacrificial layers is removed with the second preset dimension in the second direction, to form a first space. Taking the surface exposed by the sub-etched groove of the first isolation structures as etching starting points, the first isolation structure is removed with a third preset dimension in the second direction to form a second space. The sub-etched groove, the first space and the second space together constitute the grid-like etched groove.

As shown in FIG. 2E, the stacked structure 11 and the first isolation structure 15 are etched to form a sub-etched groove 16 extending in the X-axis direction. The sub-etched groove 16 has a first preset dimension L1 in a Y-axis direction. In the embodiments of the disclosure, part of the stacked structure 11 and part of the first isolation structure 15 may be removed by using a dry etching technology (e.g. a plasma etching technology, a reactive ion etching technology, or an ion beam milling technology).

In the embodiments of the disclosure, the sub-etched groove is used to define the position of transistor and the length of channel structure. The process stability of the sub-etched groove formed by the dry etching technology is higher, with respect to a wet etching technology.

In some embodiments, the fifth preset dimension L5 is greater than or equal to 1.5 times the first preset dimension L1, and the first preset dimension L1 is 20 nm to 40 nm.

As shown in FIG. 2F, taking the surface exposed by the sub-etched groove 16 of first sacrificial layer 121 and the surface exposed by the sub-etched groove 16 of the third sacrificial layer 123 as etching starting points, the first sacrificial layer 121 is removed with the second preset dimension L2 and the third sacrificial layer 123 is also removed with the second preset dimension L2 in the second direction, to form the first space H.

In the embodiments of the disclosure, by a selective etching process, the first sacrificial layer 121 can be removed with the second preset dimension L2 and the third sacrificial layer 123 can be removed with the second preset dimension L2. In the etching process, the etching selectivity ratio between the first sacrificial layer 121 and the substrate 10 is equal to the etching selectivity ratio between the third sacrificial layer 123 and the substrate 10, the etching selectivity ratio between the first sacrificial layer 121 and the substrate 10 is greater than the etching selectivity ratio between the second sacrificial layer 122 and the substrate 10, and the etching selectivity ratio between the third sacrificial layer 123 and the substrate 10 is greater than the etching selectivity ratio between the second sacrificial layer 122 and the substrate 10.

As shown in FIG. 2F and FIG. 2G, taking the surface exposed by the sub-etched groove 16 of first isolation structure 15 as etching starting points, the first isolation structure 15 is removed for a third preset dimension in the Y-axis direction to form a second space I. The sub-etched groove 16, the first space H, and the second space I together constitute a grid-like etched groove 17.

In the embodiments of the disclosure, the grid-like etched groove 17 divides the substrate into a first region A and a second region B. Since the dimension of the first region A in the Y-axis direction determines the dimension of a channel that is formed subsequently in the gate structure, the dimension of the channel in the gate structure can be adjusted by adjusting the position of the grid-like etched groove, thereby can further realize the control ability of adjusting the gate structure and improve the performance of the formed semiconductor structure.

In some embodiments, the fourth preset dimension L4 is greater than 1.5 times the first preset dimension L1, and the second preset dimension L2 is greater than 0.5 times the first preset dimension L1. For example, the second preset dimension L2 is 10 nm to 20 nm.

In the embodiments of the disclosure, the third preset dimension L3 and the second preset dimension L2 may or may not be equal, for example, the third preset dimension L3 is 10 nm to 20 nm.

Next, operation S103 and operation S104 are performed, in which a second isolation structure is formed in the grid-like etched groove, and a transistor structure and a capacitor structure are respectively formed in the first region and the second region and are isolated from each other by the second isolation structure.

In some embodiments, the second isolation structure includes a first isolation layer and a second isolation layer. The second isolation layer can be formed by the following operations. A first initial isolation layer is formed in the grid-like etched groove, and a grid-like void located between the first isolation structures and between the stacked structures is formed in the first initial isolation layer. Part falling in a projection area of the first isolation structure in the second direction, of the first initial isolation layer, and the first isolation structure located in the second region are removed by etching, so as to expose the void located between the stacked structures to form a etched trench. A first isolation material is filled in the etched trench and the exposed void located between the stacked structures. The first isolation material located in the void constitutes the second isolation layer.

As shown in FIG. 2H, a first initial isolation layer 18a is formed in the grid-like etched groove 17. A grid-like void 18b located between the first isolation structures 15 and located between the stacked structures 11 is formed in the first initial isolation layer 18a.

In the embodiments of the disclosure, the first initial isolation layer 18a may be formed by an atomic layer deposition process so as to improve the film quality of the formed first initial isolation layer 18a.

In the embodiments of the disclosure, since the fourth preset dimension L4 is greater than 1.5 times the first preset dimension L1, and the second preset dimension L2 is greater than 0.5 times the first preset dimension L1, there is the grid-like void 18b located between the first isolation structures 15 and located between the stacked structures 11, in the first initial isolation layer 18a, after forming it, and the grid-like void 18b reserves a space for the subsequent formation of the second isolation layer.

As shown in FIG. 2I and FIG. 2J, the first initial isolation layer 18a falling in the projection area of the first isolation structure 15 in the Y-axis direction and the first isolation structure 15 located in the second region B are removed by etching to expose the void located between the stacked structures 11, so as to form a etched trench 19. A first isolation material 20a is filled in the etched trench 19 and the exposed void 18b located between the stacked structures 11. The first isolation material 20a located in the void 18b constitutes the second isolation layer 20. The first isolation material 20a may be silicon oxide or other suitable materials.

In the embodiments of the disclosure, the first initial isolation layer 18a falling in the projection area of the first isolation structure 15 in the Y-axis direction and the first isolation structures 15 located in the second region B can be removed by a dry etching technology. With respect to a wet etching technology, the dry etching technology has a higher process stability.

In some embodiments, the transistor structure includes a gate structure, a source and a drain.

In some embodiments, the gate structure, the source and the drain may be formed by the following operations. The second sacrificial layer in the first region is removed to form a first etched groove. A channel structure of the transistor structure is formed in the first etched groove. The first sacrificial layer and the third sacrificial layer in the first region are removed to expose the channel structure. The gate structure is formed on the surface of the channel structure.

Still referring to FIG. 2I and FIG. 2J, the second sacrificial layer 122 in the first region A is removed to form a first etched groove 21a. In the embodiments of the disclosure, the second sacrificial layers 122 in the first region A may be removed via lateral etching by a wet etching process. An etching solution may be diluted hydrofluoric acid solution or mixed solution of diluted hydrofluoric acid and aqueous ammonia.

It should be noted that, during forming the first etched groove 21a via the lateral etching, the etching selectivity ratio between the second sacrificial layer 122 and the base 10 is greater than the etching selectivity ratio between the first sacrificial layer 121 and the base 10, and the etching selectivity ratio between the second sacrificial layer 122 and the base 10 is greater than the etching selectivity ratio between the third sacrificial layer 123 and the base 10. For example, the etching selectivity ratio between the second sacrificial layer 122 and the base 10 is greater than 10 times of the etching selectivity ratio between the first sacrificial layers 121 and the base 10.

In some embodiments, as shown in FIG. 2K, a metal oxide material is filled in the first etched groove 21a to form the channel structure 21. The metal oxide material includes an indium gallium zinc oxide (IGZO).

As shown in FIG. 2L, after forming the channel structure 21, the method for forming a semiconductor structure further includes the following operation. The first sacrificial layer 121, the third sacrificial layer 123 and the first isolation structure 15 in the first region A are removed to form a void J2 located between adjacent stacked structures, and a void J1 located between the isolation layer 13 and the channel structure 21. For example, the first sacrificial layer 121, the third sacrificial layer 123 and the first isolation structure 15 located in the first region A may be removed via the lateral etching by a wet etching process.

In some embodiments, after removing the first sacrificial layer 121, the third sacrificial layer 123 and the first isolation structure 15 located in the first region A, the method for forming a semiconductor structure further includes the following operation. An ion implantation is performed on a first end C of the channel structure 21 in the Y-axis direction to form a source or a drain.

In some embodiments, the gate structure may be formed by the following operations. Gate dielectric layers and initial gate conductive layers are formed in sequence on the surface of the channel structure, and a third isolation structure is formed in a void between the initial gate conductive layers and in a void between the stacked structures. The initial gate conductive layers are etched back in the second direction to form gate conductive layers and a third space. The gate dielectric layer and the gate conductive layer together constitute the gate structure.

As shown in FIG. 2M, a gate dielectric material and a gate conductive material are deposited in sequence on the surface of channel structure 21 to form the gate dielectric layer 221 and an initial gate conductive layer 222a. In the embodiments of the disclosure, the gate dielectric material may be silicon oxide or other suitable materials. The gate conductive material may be any material with a good conductivity, for example, titanium, titanium nitride, tungsten, cobalt, platinum, palladium, ruthenium or copper.

In the embodiments of the disclosure, the gate dielectric layer 221 and the initial gate conductive layer 222a may be formed by any suitable deposition process, for example, a chemical vapor deposition process, a physical vapor deposition process or an atomic layer deposition process.

Still referring to FIG. 2L and FIG. 2M, a third isolation material is deposited in a void between the initial gate conductive layers 222a and the void J2 between the stacked structures to form a third isolation structure 23. The third isolation material may be silicon oxide or any other suitable materials.

As shown in FIG. 2M and FIG. 2N, the initial gate conductive layer 222a is etched back in the Y-axis direction to form the gate conductive layer 222 and a third space J. The gate dielectric layer 221 and the gate conductive layer 222 constitute the gate structure 22.

In the embodiments of the disclosure, a stacked structure formed by stacking a plurality of gate structures in the Z-axis direction can form a three-dimensional semiconductor structure, so that the integration level of the semiconductor structure can be improved, realizing the miniaturization.

In some embodiments, as shown in FIG. 2N and FIG. 2O, the method for forming a semiconductor structure further includes the following operation. The third isolation material is deposited in the third space J to form a fourth isolation structure 23a. The fourth isolation structure 23a and the third isolation structure 23 constitute the isolation structure of adjacent gate structures in the Z-axis direction.

In some embodiments, the method for forming a semiconductor structure further includes the following operation. A plurality of bit line structures arranged in sequence in the first direction and extending in the third direction are formed. Each of the bit line structures is connected to the channel structure.

As shown in FIG. 2P, the plurality of bit line structures 24 are arranged in sequence in the X-axis direction and extend in the Z-axis direction. Each bit line structure 24 is contacted to the first end C of a channel pillar arranged in the Z-axis direction.

In the embodiments of the disclosure, the material of the bit line structure 24 includes tungsten (W), cobalt (Co), copper (Cu), aluminum (Al), titanium nitride (TiN), a titanium-containing metal layer, polysilicon, or any combination thereof.

In the embodiments of the disclosure, after forming the plurality of bit line structures, the method for forming a semiconductor structure further includes an operation of forming a capacitor structure in the second region.

In some embodiments, the capacitor structure and the first isolation layer may be formed by the following operations. The second sacrificial layer in the second region is removed to form a second etched groove. The first initial isolation layer exposed by the second etched groove is removed by etching until the second isolation layer and the channel structures are exposed to form a fourth space, in which the remaining first initial isolation layer constitutes the first isolation layer. The first sacrificial layer and the third sacrificial layer in the second region are removed to form a third etched groove, and the third etched groove includes the second etched groove and the fourth space. The capacitor structure is formed in the third etched groove.

As shown in FIG. 2P and FIG. 2Q, the second sacrificial layer 122 in the second region B is removed to form the second etched groove 26.

As shown in FIG. 2Q to FIG. 2S, the first initial isolation layer 18a exposed by the second etched groove 26 is removed by etching until the second isolation layer 20 and the second end D of the channel structure 21 are exposed to form the fourth space K. The remaining first initial isolation layer 18a constitutes the first isolation layer 18. In the embodiments of the disclosure, the first isolation layer 18 may be in contact with the first sacrificial layer 121 and the third sacrificial layer 123 in the second region B (as shown in FIG. 2R), or the first isolation layer 18 may not be in contact with the first sacrificial layer 121 and the third sacrificial layer 123 in the second region B (as shown in FIG. 2S).

In some embodiments, the etching selectivity ratio between the first initial isolation layer 18a and the base 10 is greater than the etching selectivity ratio between the second isolation layer 20 and the base 10, so that the first initial isolation layer can be removed by etching without damaging the second isolation layer, that is, the second isolation layer can act as an etching stop layer during the etching process.

As shown in FIG. 2S to FIG. 2U, the first sacrificial layer 121 and the third sacrificial layer 123 in the second region B are removed to form the third etched groove 27. The third etched groove 27 includes the second etched groove 26 and the fourth space K. A first electrode material, a dielectric material, and a second electrode material are deposited in sequence on the sidewall of the third etched groove 27 to form a first electrode layer 251, a dielectric layer 252, and a second electrode layer 253, thereby forming the capacitor structure 25. The first electrode layer 251 is in contact with a second end D of the channel structure 21, and the second electrode layer 253 fully fills the third etched groove 27.

In the embodiments of the disclosure, both the first electrode material and the second electrode material may include a metal nitride or a metal silicide, for example, titanium nitride. The dielectric material may include a high-K dielectric material, for example, one or any combination of lanthanum oxide ($La_2O_3$), aluminum oxide ($Al_2O_3$), hafnium oxide ($HfO_2$), hafnium oxynitride (HfON), hafnium silicate (HfSiOx) or zirconia ($ZrO_2$). In other embodiments, the first electrode material and second electrode material may be polysilicon.

In the embodiments of the disclosure, the first electrode layer 251, the dielectric layer 252, and the second electrode layer 253 may be formed by any of the following deposition processes: a chemical vapor deposition process, a physical vapor deposition process, and an atomic layer deposition process.

In some embodiments, referring to FIG. 2R, prior to forming the capacitor structure, the method for forming a semiconductor structure further includes an operation of performing an ion implantation on the second end D of the channel structure 21 to form a drain or a source.

The capacitor structure formed in the embodiments of the disclosure extends in the second direction, that is, the capacitor structure in the embodiments of the disclosure is horizontal. With respect to a vertical capacitor structure with a high aspect ratio, the horizontal capacitor structure can reduce the possibility of toppling or breaking, thereby improving the stability of the capacitor structure. In addition, the stacked structure formed by stacking a plurality of capacitor structures in the third direction can form a three-dimensional semiconductor structure, so that the integration level of the semiconductor structure can be improved, realizing the miniaturization.

In the embodiments of the disclosure, by forming the second isolation structure (including the first isolation layer and the second isolation layer) as an isolation structure between the transistor structure and the capacitor structure in the semiconductor structure, the transistor structures in different layers of the semiconductor structure have the same length, and the capacitor structures in different layers also can have the same length. In addition, in the embodiments of the disclosure, the above effect can be realized without forming a supporting structure, which simplifies the manufacturing process of the semiconductor structure.

In addition, in the embodiments of the disclosure, the low K material and silicon oxide are adopted as the first isolation layer and the second isolation layer, respectively, so that the parasitic capacitance of the semiconductor structure can be reduced, thereby reducing the capacitance resistance delay and optimizing the response time of the semiconductor structure.

In addition, the embodiments of the disclosure also provide a semiconductor structure. As shown in FIG. 2U, the semiconductor structure includes: a substrate; a second isolation structure located in the substrate, including a second isolation layer 20 and a first isolation layer 18 surrounding part of the second isolation layer 20, and dividing the substrate into a first region A and a second region B arranged in sequence in a Y-axis direction; transistor structures located in the first region A and arranged in an array in an X-axis direction and a Z-axis direction; and capacitor structures located in the second region B and arranged in an array in the X-axis direction and the Z-axis direction. The transistor structures and the capacitor structures are isolated by the first isolation layer 18 and the second isolation layer 20.

In the embodiments of the disclosure, a stacked structure formed by stacking a plurality of transistor structures and a plurality of capacitor structures in the third direction can form a three-dimensional semiconductor structure, so that the integration level of the semiconductor structure can be improved and the miniaturization can be realized.

In some embodiments, referring to FIG. 2U, the substrate includes a base 10, and the transistor structures and the capacitor structures are located on the surface of the base 10. The etching selectivity ratio between the first isolation layer 18 and the base 10 is greater than the etching selectivity ratio between the second isolation layer 20 and the base 10.

In some embodiments, still referring to FIG. 2U, each of the transistor structures includes a channel structure 21 and a gate structure 22. The gate structure 22 includes a gate dielectric layer 221 located on the surface of the channel structure 21 and a gate conductive layer 222 located on a surface of the gate dielectric layer 221. The channel structure 21 is composed of a metal oxide material, and the metal oxide material includes an indium gallium zinc oxide.

In some embodiments, still referring to FIG. 2U, the channel structure 21 includes a first end and a second end in the Y-axis direction. The semiconductor structure further includes a capacitor structure 25 connected to the second end, and the capacitor structure 25 includes a first electrode layer 251, a dielectric layer 252 and a second electrode layer 253.

In some embodiments, the semiconductor structure further includes an isolation layer 13. The isolation layer 13 is located between adjacent gate structures 22 in the Z-axis direction and is located between adjacent capacitor structures 25 in the Z-axis direction.

In some embodiments, still referring to FIG. 2U, the semiconductor structure further includes a bit line structure 24 connected to the first end, Bit line structures 24 are arranged in sequence in the X-axis direction and extend in the Z-axis direction.

In some embodiments, still referring to FIG. 2U, the semiconductor structure further includes a third isolation structure 23 located between adjacent gate structures 22.

In some embodiments, still referring to FIG. 2U, the semiconductor structure further includes a first isolation material 20a located between adjacent capacitor structures 25 in the X-axis direction.

The semiconductor structure provided by the embodiments of the disclosure is similar to the method for forming a semiconductor structure in the above-mentioned embodiments. The technical features not disclosed in detail in this embodiment of the disclosure can be understood with reference to the above-mentioned embodiments, which will not be repeated here.

The semiconductor structure provided by the embodiments of the disclosure includes the second isolation structure. Since the second isolation structure can be used as an isolation structure between the transistor structure and the capacitor structure in the semiconductor structure, transistor structures of different layers each have the same length, and capacitor structures of different layers each have the same length. In addition, since the second isolation structure includes the first isolation layer and the second isolation layer, and the low K material and silicon oxide are adopted as the first isolation layer and the second isolation layer, respectively, so that the parasitic capacitance of the semiconductor structure can be reduced, thereby reducing the capacitance resistance delay and optimizing the response time of the semiconductor structure.

In several embodiments provided by the disclosure, it should be understood that the disclosed devices and methods may be implemented in a non-target way. The above-described device embodiments are only illustrative. For example, the division of the units is only a logical function division, and there may be other division modes in actual implementation, such as, multiple units or components may be combined or integrated into another system, or some features may be ignored or not executed. In addition, the components shown or discussed can be coupled, or directly coupled to each other.

The features disclosed in several method or device embodiments provided by the disclosure may be arbitrarily combined without conflict to obtain a new method embodiment or device embodiment.

The above description only refers to some embodiments of the disclosure, but the protection scope of the disclosure is not limited to this. Changes or replacements can be easily conceived by any person skilled in the art and such changes or replacements should be covered by the protection scope of the disclosure. Therefore, the protection scope of the disclosure should be subject to the protection scope of the claims.

In the semiconductor structure and the method for forming the same provided by the embodiments of the disclosure, by forming the second isolation structure as an isolation structure between the transistor structure and the capacitor structure in the semiconductor structure, transistor structures of different layers each have the same length, and capacitor structures of different layers each have the same length. In addition, in the embodiments of the disclosure, the above effect can be realized without forming a supporting structure, which simplifies the manufacturing process of the semiconductor structure.

The invention claimed is:

1. A method for forming a semiconductor structure, comprising:

providing a substrate, wherein the substrate comprises a stacked structure and first isolation structure that are alternately arranged in a first direction;

forming a grid-like etched groove extending in the first direction in the stacked structure and the first isolation structure, wherein the grid-like etched groove divides the substrate into a first region and a second region that are arranged sequentially in a second direction, and the first direction and the second direction are any two directions in a plane where the substrate is located;

forming a second isolation structure in the grid-like etched groove; and respectively forming a transistor structure and a capacitor structure in the first region and the second region, wherein the transistor structure and the capacitor structure are isolated by the second isolation structure.

2. The method according to claim 1, wherein the stacked structure comprises a sacrificial layer and an isolation layer that are alternately stacked in a third direction, the third direction is intersected with the plane where the substrate is located, and the sacrificial layer comprises a first sacrificial layer, a second sacrificial layer and a third sacrificial layer that are stacked sequentially in the third direction;

wherein forming a second isolation structure in the grid-like etched groove comprises:

etching the stacked structure and the first isolation structure to form a sub-etched groove extending in the first direction, wherein the sub-etched groove has a first preset dimension in the second direction;

taking a surface exposed by the sub-etched groove, of the first sacrificial layer and a surface exposed by the sub-etched groove, of third sacrificial layer as an etching starting point, removing the first sacrificial layer with a second preset dimension and the third sacrificial layers with the second preset dimension in the second direction to form a first space; and taking a surface exposed by the sub-etched groove, of the first isolation structure as an etching starting point, removing the first isolation structure with a third preset dimension in the second direction to form a second space, wherein the sub-etched groove, the first space and the second space together constitute the grid-like etched groove.

3. The method according to claim 2, wherein both the first sacrificial layer and the third sacrificial layer have a fourth preset dimension in the third direction, wherein the fourth preset dimension is greater than 1.5 times the first preset dimension, and the second preset dimension is greater than 0.5 times the first preset dimension.

4. The method according to claim 3, wherein the first isolation structure has a fifth preset dimension in the first direction, wherein the fifth preset dimension is greater than or equal to 1.5 times the first preset dimension.

5. The method according to claim 4, wherein the second isolation structure comprises a first isolation layer and a second isolation layer, and forming the second isolation layer comprises:

forming a first initial isolation layer in the grid-like etched groove, wherein grid-like voids located between first isolation structures and located between stacked structures are formed in the first initial isolation layer;

removing part located in a projection area of the first isolation structure in the second direction, of the first initial isolation layer falling, and part located in the second region, of the first isolation structure by etching, so as to expose a void located between the stacked structures to form a etched trench; and filling a first isolation material in the etched trench and the exposed void located between the stacked structures, wherein the first isolation material located in the void constitutes the second isolation layer.

6. The method according to claim 5, wherein the transistor structure is formed by following operations:

removing the second sacrificial layer in the first region to form a first etched groove;

forming a channel structure of the transistor structure in the first etched groove;

removing the first sacrificial layer, the third sacrificial layer and the first isolation structure in the first region to expose the channel structure; and forming a gate structure on a surface of the channel structure.

7. The method according to claim 6, wherein forming the channel structure of the transistor structure in the first etched groove comprises:

filling a metal oxide material in the first etched groove to form the channel structure, wherein the metal oxide material comprises an indium gallium zinc oxide.

8. The method according to claim 7, wherein forming the gate structure on the surface of the channel structure comprises:

sequentially forming a gate dielectric layer and an initial gate conductive layer on the surface of the channel structure;

forming a third isolation structure in a void between initial gate conductive layers and the void between the stacked structures; and etching back the initial gate conductive layer in the second direction to form a gate conductive layer and a third space; wherein the gate dielectric layer and the gate conductive layer together constitute each of the gate structures.

9. The method according to claim 8, further comprising:

forming a plurality of bit line structures that are sequentially arranged in the first direction and extend in the third direction, wherein the bit line structure is connected to the channel structure.

10. The method according to claim 9, wherein the capacitor structure and the first isolation layer are formed by following operations:

removing the second sacrificial layer in the second region to form a second etched groove;

removing part exposed by the second etched groove of the first initial isolation layer by etching until the second isolation layer and the channel structure are exposed to form a fourth space, wherein a remaining part of the first initial isolation layer constitutes the first isolation layer;

removing the first sacrificial layer and the third sacrificial layer in the second region to form a third etched groove, wherein the third etched groove comprises the second etched groove and a fourth space; and forming the capacitor structure in the third etched groove.

11. The method according to claim 10, wherein forming the capacitor structure in the third etched groove comprises:

sequentially forming a first electrode layer, a dielectric layer and a second electrode layer on a sidewall of the third etched groove to form the capacitor structure;

wherein the first electrode layer is connected to the channel structure, and the second electrode layer fully fills the third etched groove.

12. The method of claim 5, wherein the substrate further comprises a base; the stacked structure and the first isolation structure are formed on a surface of the base by the following operations:

forming an initial stacked structure on the surface of the base, wherein the initial stacked structure comprises sacrificial layers and isolation layers that are sequentially stacked in the third direction;

forming a photoresist layer with a preset pattern on a surface of the initial stacked structure, wherein the preset pattern comprises sub-patterns arranged at intervals in the first direction; and the sub-patterns expose the initial stacked structure;

removing the exposed initial stacked structure by the photoresist layer to form an isolation groove and the stacked structure that are arranged at intervals in the first direction; and forming the first isolation structures in the isolation groove.

13. The method according to claim 12, wherein an etching selectivity ratio between the first initial isolation layer and the base is greater than an etching selectivity ratio between the second isolation layer and the base.

\* \* \* \* \*